United States Patent
Mori et al.

(10) Patent No.: US 8,502,285 B2
(45) Date of Patent: Aug. 6, 2013

(54) THIN-FILM TRANSISTOR AND INTERMEDIATE OF THIN-FILM TRANSISTOR

(75) Inventors: Satoru Mori, Okegawa (JP); Shozo Komiyama, Sanda (JP)

(73) Assignees: Mitsubishi Materials Corporation, Tokyo (JP); Ulvac, Inc., Chigasaki-shi (JP)

( * ) Notice: Subject to any disclaimer, the term of this patent is extended or adjusted under 35 U.S.C. 154(b) by 56 days.

(21) Appl. No.: 12/737,797

(22) PCT Filed: Sep. 24, 2009

(86) PCT No.: PCT/JP2009/004822
§ 371 (c)(1),
(2), (4) Date: Feb. 17, 2011

(87) PCT Pub. No.: WO2010/035463
PCT Pub. Date: Apr. 1, 2010

(65) Prior Publication Data
US 2011/0133190 A1   Jun. 9, 2011

(30) Foreign Application Priority Data
Sep. 26, 2008   (JP) ................ 2008-247460

(51) Int. Cl.
*H01L 29/786* (2006.01)
(52) U.S. Cl.
USPC ........................................ 257/288
(58) Field of Classification Search
USPC .......... 257/213, 215, 288, E29.116, E29.169; 438/142, 149, 161
See application file for complete search history.

(56) References Cited

U.S. PATENT DOCUMENTS 6,399,496 B1 * 6/2002 Edelstein et al. ............ 438/687
6,423,433 B1 * 7/2002 Lopatin et al. ............... 428/702
(Continued)

FOREIGN PATENT DOCUMENTS

CN   101253610 A   8/2008
JP   02-224254 A   9/1990
(Continued)

OTHER PUBLICATIONS

International Search Report dated Oct. 20, 2009, issued for PCT/JP2009/004822.
(Continued)

*Primary Examiner* — Jarrett Stark
*Assistant Examiner* — Michele Fan
(74) *Attorney, Agent, or Firm* — Edwards Wildman Palmer LLP

(57) ABSTRACT

This thin-film transistor includes a drain electrode film and a source electrode film, each of which includes a composite copper alloy film including a copper alloy underlayer that is formed so as to come into contact with a barrier film and a Cu layer that is formed on the copper alloy underlayer. One aspect of the copper alloy underlayer includes a concentrated layer including 2 mol % to 30 mol % of Ca, 20 mol % to 50 mol % of oxygen, and Cu and inevitable impurities as the balance. Another aspect of the copper alloy underlayer includes a concentrated layer including 2 mol % to 30 mol % of Ca, 1 mol % to 10 mol % in total of one or more selected from the group consisting of Al, Sn, and Sb, 20 mol % to 50 mol % of oxygen, and Cu and inevitable impurities as the balance.

3 Claims, 6 Drawing Sheets

U.S. PATENT DOCUMENTS

| | | | |
|---|---|---|---|
| 7,943,933 | B2 | 5/2011 | Hino et al. |
| 2006/0127606 | A1 | 6/2006 | Ogasawara et al. |
| 2008/0009108 | A1* | 1/2008 | Lin et al. .................. 438/158 |
| 2009/0303406 | A1* | 12/2009 | Takasawa et al. ............ 349/39 |

FOREIGN PATENT DOCUMENTS

| | | | |
|---|---|---|---|
| JP | 04-349637 | A | 12/1992 |
| JP | 08-026889 | A | 1/1996 |
| JP | 2002-094069 | A | 3/2002 |
| JP | 2004-163901 | A | 6/2004 |
| JP | 2008191541 | A * | 8/2008 |
| JP | 2008205420 | A * | 9/2008 |
| JP | 2008311283 | A * | 12/2008 |
| WO | WO 2008081806 | A1 * | 7/2008 |

OTHER PUBLICATIONS

International Search Report dated Oct. 20, 2009, issued for PCT/JP2009/004823.

*Ex Parte Quayle* Action dated Mar. 30, 2012, issued for U.S. Appl. No. 12/998,283.

Office Action dated Aug. 20, 2012, issued for the Chinese Patent Application No. 200980141877.X and English translation thereof.

Office Action mailed Aug. 3, 2012, issued for the Japanese Patent Application No. 2008-252241 and English translation thereof.

\* cited by examiner

THIN-FILM TRANSISTOR AND INTERMEDIATE OF THIN-FILM TRANSISTOR

TECHNICAL FIELD

The present invention relates to a thin-film transistor used in various kinds of displays and a thin-film transistor intermediate (an intermediate of a thin-film transistor) for manufacturing the transistor. More particularly, the present invention relates to a thin-film transistor and a thin-film transistor intermediate including a drain electrode and a source electrode with high adhesion.

The present application claims priority on Japanese Patent Application No. 2008-247460, filed on Sep. 26, 2008, the content of which is incorporated herein by reference.

BACKGROUND ART

Liquid crystal displays, plasma displays, organic EL displays, and inorganic EL displays have been known as flat panel displays in which thin-film transistors are used that are driven by an active matrix scheme. In the flat panel display in which the thin-film transistors are used, lines consisting of metal films closely adhere to the surface of a glass substrate in a lattice shape, and the thin-film transistors are provided at the intersection points of the lattice-shaped lines consisting of metal film.

As shown in a schematic cross-sectional view of FIG. 5, the thin-film transistor includes a gate electrode film 2 which consists of a pure copper film formed on the surface of a glass substrate 1, a silicon nitride ($SiN_x$) film 3 formed on the gate electrode film 2 and the glass substrate 1, an $n^-$ amorphous Si semiconductor film 4 formed on the silicon nitride ($SiN_x$) film 3, an $n^+$ amorphous Si ohmic film 4' formed on the $n^-$ amorphous Si semiconductor film 4, and a drain electrode film 5 and a source electrode film 6 which consists of pure copper and are formed on the $n^+$ amorphous Si ohmic film 4'.

The thin-film transistor having the layer structure is manufactured as follows. First, as shown in a cross-sectional view of FIG. 6, the gate electrode film 2 consisting of pure copper is formed on the surface of the glass substrate 1, and the silicon nitride ($SiN_x$) film 3 is formed on the gate electrode film 2 and the glass substrate 1. Then, the $n^-$ amorphous Si semiconductor film 4 is formed on the silicon nitride ($SiN_x$) film 3, and the $n^+$ amorphous Si ohmic film 4' is formed on the $n^-$ amorphous Si semiconductor film 4. Thereafter, a pure copper film 8 is formed so as to cover the entire surface of the $n^+$ amorphous Si ohmic film 4'. In this way, a laminate 9 is manufactured.

Then, in the laminate 9 shown in FIG. 6, wet etching is performed on a portion of the pure copper film 8 immediately above the gate electrode 2, and plasma etching is performed on the $n^+$ amorphous Si ohmic film 4'. Thereby, an isolation trench 7 is formed, and the $n^-$ amorphous Si semiconductor film 4 is exposed. In this way, the drain electrode film 5 and the source electrode film 6 are formed. By the above-mentioned process, a thin-film transistor intermediate (an intermediate of a thin-film transistor) 10 shown in the cross-sectional view of FIG. 5 is manufactured.

Even when plasma etching is performed on only the $n^+$ amorphous Si ohmic film 4' in the laminate 9 in order to form the isolation trench 7, the surface of the $n^-$ amorphous Si semiconductor film 4 cannot be escaped from being affected by the plasma etching since it is exposed to the plasma etching. Therefore, the surface of the $n^-$ amorphous Si semiconductor film 4 which is exposed through the isolation trench 7 becomes rough, and an amount of dangling-bonds increases, which causes a surface defect. The surface defect increases an off-current of the thin-film transistor. As a result, the contrast of an LCD is reduced or an angle of view of the LCD is reduced.

In order to solve the above-mentioned problems, a technique has been known in which a hydrogen plasma treatment is performed on the surface of the $n^-$ amorphous Si semiconductor film 4 which is exposed through the isolation trench 7, and dangling-bonds on the surface of the $n^-$ amorphous Si semiconductor film 4 are combined with hydrogen atoms by the hydrogen plasma treatment so as to stabilize the $n^-$ amorphous Si semiconductor film; and thereby, a leakage current is reduced. It has been known that the hydrogen plasma treatment is preferably performed under conditions where a 100% hydrogen gas is used, a hydrogen gas flow rate is in a range of 10 SCCM to 1000 SCCM, a hydrogen gas pressure is in a range of 10 Pa to 500 Pa, an RF current density is in a range of 0.005 $W/cm^2$ to 0.5 $W/cm^2$, and a process time is in a range of 1 minute to 60 minutes (see Patent Document 1).

In the case where Si in the $n^+$ amorphous Si ohmic film 4' is diffused into the drain electrode film 5 and the source electrode film 6, the specific resistances of the drain electrode film 5 and the source electrode film 6 increase. Although not shown in the drawings, in order to prevent the increasing of the specific resistance of the drain electrode film 5 and the source electrode film 6, a technique has been known in which a barrier film is formed between the $n^+$ amorphous Si ohmic film 4' and the drain electrode film 5, another barrier film is also formed between the $n^+$ amorphous Si ohmic film 4' and the source electrode film 6, and a Mo film, a Mo alloy film, a Ti film or a Ti alloy film is generally used as the barrier film (see Patent Document 2).

In general, a pure copper film is used as the drain electrode film 5 and the source electrode film 6. The pure copper film has low adhesion to a ceramic substrate made of glass, alumina, or silicon dioxide. In order to improve the adhesion to the ceramic substrate, a technique has been known in which a copper film including oxygen is formed as an underlayer on the surface of the ceramic substrate, and a pure copper film is formed on the underlayer, which is the copper film including oxygen; and thereby, a composite copper film is obtained (see Patent Document 3). In the composite copper film, the copper film including oxygen comes into contact with the ceramic substrate. In this way, it is possible to improve the adhesion to the ceramic substrate.

As described above, in a process of manufacturing the thin-film transistor, it is required to conduct the hydrogen plasma treatment process for combining dangling-bonds on the surface of the $n^-$ amorphous Si semiconductor film 4 with hydrogen atoms so as to stabilize the $n^-$ amorphous Si semiconductor film. However, in the case where the hydrogen plasma treatment is performed, the adhesion of the drain electrode film and the source electrode film consisting of pure copper films, to the $n^+$ amorphous Si ohmic film 4' is reduced.

In order to prevent the reduction of the adhesion, known composite copper films which consisted of a copper film including oxygen as an underlayer, and a pure copper film formed on the underlayer were used as a drain electrode film and a source electrode film. However, the inventors found that, in the composite copper film after the hydrogen plasma treatment, sufficient adhesion to the $n^+$ amorphous Si ohmic film 4' was not obtained, and the drain electrode film and the source electrode film peeled off, which might cause a defect in the thin-film transistor.

3

PRIOR ART DOCUMENTS

Patent Documents

Patent Document 1: Japanese Unexamined Patent Application, First Publication No. H04-349637
Patent Document 2: Japanese Unexamined Patent Application, First Publication No. 2004-163901
Patent Document 3: Japanese Unexamined Patent Application, First Publication No. H08-26889

DISCLOSURE OF THE INVENTION

Problems to be Solved by the Invention

The present invention aims to provide a thin-film transistor and an intermediate of a thin-film transistor including a drain electrode and a source electrode with high adhesion.

Means for Solving the Problems

The inventors conducted a study on a technique capable of manufacturing an intermediate of a thin-film transistor including a drain electrode film and a source electrode film with high adhesion, manufacturing a thin-film transistor including a drain electrode film and a source electrode film with high adhesion by using the intermediate of a thin-film transistor. As a result, the inventors obtained the following study results.

(a) It is possible to manufacture an intermediate of a thin-film transistor 110 including a drain electrode film 5 and a source electrode film 6 with high adhesion according to a first aspect of the present invention shown in a cross-sectional view of FIG. 1 by the following method.

Instead of a metal film such as a Mo film or a Ti film which has been known as a barrier film of the thin-film transistor, a silicon oxide ($SiO_x$) film can be used as the barrier film to further improve the adhesion of the drain electrode film and the source electrode film, which is preferable.

From this viewpoint, at first, as shown in a cross-sectional view of FIG. 2, a gate electrode film 2 is formed on a glass substrate 1, and a silicon nitride film 3 is formed on the glass substrate 1 and the gate electrode film 2. Then, an n⁻ amorphous Si semiconductor film 4 is formed on the silicon nitride film 3, and an n⁺ amorphous Si ohmic film 4' is formed on the n⁻ amorphous Si semiconductor film 4. Thereafter, a barrier film 11 including a silicon oxide ($SiO_x$) film is formed on the n⁺ amorphous Si ohmic film 4'.

Then, a copper alloy underlayer containing oxygen and calcium 112 is formed on the barrier film 11 including the silicon oxide ($SiO_x$) film, and a Cu layer 113 is formed on the copper alloy underlayer containing oxygen and calcium 112. A composite copper alloy film 114 includes the copper alloy underlayer containing oxygen and calcium 112 and the Cu layer 113. The copper alloy underlayer containing oxygen and calcium 112 has a component composition including 0.01 mol % to 10 mol % of Ca, 1 mol % to 20 mol % of oxygen, and as the remainder, Cu and inevitable impurities. In this way, a laminate 109 is manufactured.

In the laminate 109, wet etching is performed on a portion of the composite copper alloy film 114 immediately above the gate electrode 2, and plasma etching is performed on the barrier film 11 including the silicon oxide film, and the n⁺ amorphous Si ohmic film 4'. Thereby, an isolation trench 7 is formed, and the n⁻ amorphous Si semiconductor film 4 is exposed; and as a result, the drain electrode film 5 and the source electrode film 6 are formed. In this way, it is possible to manufacture the intermediate of a thin-film transistor 110 according to the first aspect shown in the cross-sectional view of FIG. 1.

(b) By performing a hydrogen plasma treatment on the intermediate of a thin-film transistor 110 according to the first aspect shown in FIG. 1, it is possible to manufacture a thin-film transistor including a drain electrode film and a source electrode film with high adhesion according to the first aspect of the present invention.

When the hydrogen plasma treatment is performed on the intermediate of a thin-film transistor 110 according to the first aspect, a concentrated layer having high concentrations of Ca and oxygen is formed in the copper alloy underlayer containing oxygen and calcium 112. The concentrated layer has a component composition including 2 mol % to 30 mol % of Ca, 20 mol % to 50 mol % of oxygen, and as the remainder, Cu and inevitable impurities.

In this way, the copper alloy underlayer containing oxygen and calcium 112 is changed to a copper alloy underlayer containing an oxygen-calcium concentrated layer (not shown) including the concentrated layer, and a composite copper alloy film including the copper alloy underlayer containing an oxygen-calcium concentrated layer and a Cu layer is generated. Since the drain electrode film and the source electrode film each have the composite copper alloy film including the copper alloy underlayer containing an oxygen-calcium concentrated layer and the Cu layer, the adhesion of the drain electrode film and the source electrode film to the barrier film 11 is significantly improved.

(c) It is possible to manufacture an intermediate of a thin-film transistor 210 including a drain electrode film 5 and a source electrode film 6 with high adhesion according to a second aspect of the present invention shown in a cross-sectional view of FIG. 3 by the following method.

Instead of a metal film such as a Mo film or a Ti film which has been known as a barrier film of the thin-film transistor, a silicon oxide ($SiO_x$) film can be used as the barrier film to further improve the adhesion of the drain electrode film and the source electrode film, which is preferable.

From this viewpoint, at first, as shown in a cross-sectional view of FIG. 4, a gate electrode film 2 is formed on a glass substrate 1, and a silicon nitride film 3 is formed on the glass substrate 1 and the gate electrode film 2. Then, an n⁻ amorphous Si semiconductor film 4 is formed on the silicon nitride film 3, and an n⁺ amorphous Si ohmic film 4' is formed on the n⁻ amorphous Si semiconductor film 4. Thereafter, a barrier film 11 including a silicon oxide ($SiO_x$) film is formed on the n⁺ amorphous Si ohmic film 4'.

Then, an oxygen-Ca (Al, Sn, Sb) copper alloy intermediate underlayer 212 is formed on the barrier film 11 including the silicon oxide ($SiO_x$) film, and a Cu alloy layer 213 is formed on the oxygen-Ca (Al, Sn, Sb) copper alloy intermediate underlayer 212. A composite copper alloy film 214 includes the oxygen-Ca (Al, Sn, Sb) copper alloy intermediate underlayer 212 and the Cu alloy layer 213. The oxygen-Ca (Al, Sn, Sb) copper alloy intermediate underlayer 212 is a copper alloy underlayer having a component composition including 0.2 mol % to 10 mol % of Ca, 0.05 mol % to 2 mol % in total of one or more selected from the group consisting of Al, Sn, and Sb, 1 mol % to 20 mol % of oxygen, and as the remainder, Cu and inevitable impurities (hereinafter, the copper alloy underlayer having this component composition is referred to as an "oxygen-Ca (Al, Sn, Sb) copper alloy intermediate underlayer"). In this way, a laminate 209 is manufactured.

In the laminate 209, wet etching is performed on a portion of the composite copper alloy film 214 immediately above the gate electrode 2, and plasma etching is performed on the barrier film 11 including the silicon oxide film, and the n+ amorphous Si ohmic film 4'. Thereby, an isolation trench 7 is formed, and the n− amorphous Si semiconductor film 4 is exposed; and as a result, the drain electrode film 5 and the source electrode film 6 are formed. In this way, it is possible to manufacture the intermediate of a thin-film transistor 210 according to the second aspect shown in the cross-sectional view of FIG. 3.

(d) By performing a hydrogen plasma treatment on the intermediate of a thin-film transistor 210 according to the second aspect shown in FIG. 3, it is possible to manufacture a thin-film transistor including a drain electrode film and a source electrode film with high adhesion according to the second aspect of the present invention.

When the hydrogen plasma treatment is performed on the intermediate of a thin-film transistor 210 according to the second aspect, a concentrated layer having high concentrations of Ca, Al, Sn, Sb and oxygen is formed in the oxygen-Ca (Al, Sn, Sb) copper alloy intermediate underlayer 212. The concentrated layer has a component composition including 2 mol % to 30 mol % of Ca, 1 mol % to 10 mol % in total of one or more selected from the group consisting of Al, Sn, and Sb, 20 mol % to 50 mol % of oxygen, and as the remainder, Cu and inevitable impurities.

In this way, the oxygen-Ca (Al, Sn, Sb) copper alloy intermediate underlayer 212 is changed to a copper alloy underlayer including the concentrated layer (hereinafter, the copper alloy underlayer including the concentrated layer is referred to as an "copper alloy underlayer containing an oxygen-Ca (Al, Sn, Sb) concentrated layer") (not shown), and a composite copper alloy film including the copper alloy underlayer containing an oxygen-Ca (Al, Sn, Sb) concentrated layer and a Cu alloy layer is generated. Since the drain electrode film and the source electrode film each have the composite copper alloy film including the copper alloy underlayer containing an oxygen-Ca (Al, Sn, Sb) concentrated layer and the Cu alloy layer, the adhesion of the drain electrode film and the source electrode film to the barrier film 11 is significantly improved.

The present invention is based on the above-mentioned study results and has the following features.

(1) A thin-film transistor according to a first aspect of the present invention includes a glass substrate, a gate electrode film that is formed on the glass substrate, a silicon nitride film that is formed on the glass substrate and the gate electrode film, an n− amorphous Si semiconductor film that is formed on the silicon nitride film, an n+ amorphous Si ohmic film that is formed on the n− amorphous Si semiconductor film, a barrier film that includes a silicon oxide film formed on the n+ amorphous Si ohmic film, and a drain electrode film and a source electrode film that are formed on the barrier film including the silicon oxide film.

Each of the drain electrode film and the source electrode film includes a composite copper alloy film which includes: at least a copper alloy underlayer containing an oxygen-calcium concentrated layer that is formed so as to come into contact with the barrier film including the silicon oxide film; and a Cu layer that is formed on the copper alloy underlayer containing an oxygen-calcium concentrated layer.

The copper alloy underlayer containing an oxygen-calcium concentrated layer includes a concentrated layer.

The concentrated layer includes 2 mol % to 30 mol % of Ca, 20 mol % to 50 mol % of oxygen, and as the remainder, Cu and inevitable impurities.

(2) An intermediate of a thin-film transistor according to the first aspect of the present invention includes a glass substrate, a gate electrode film that is formed on the glass substrate, a silicon nitride film that is formed on the glass substrate and the gate electrode film, an n− amorphous Si semiconductor film that is formed on the silicon nitride film, an n+ amorphous Si ohmic film that is formed on the n− amorphous Si semiconductor film, a barrier film that includes a silicon oxide film formed on the n+ amorphous Si ohmic film, and a drain electrode film and a source electrode film that are formed on the barrier film including the silicon oxide film.

Each of the drain electrode film and the source electrode film includes a composite copper alloy film which includes: a copper alloy underlayer containing oxygen and calcium that is formed so as to come into contact with the barrier film including the silicon oxide film; and a Cu layer that is formed on the copper alloy underlayer containing oxygen and calcium.

The copper alloy underlayer containing oxygen and calcium includes 0.01 mol % to 10 mol % of Ca, 1 mol % to 20 mol % of oxygen, and as the remainder, Cu and inevitable impurities.

(3) A thin-film transistor according to a second aspect of the present invention includes a glass substrate, a gate electrode film that is formed on the glass substrate, a silicon nitride film that is formed on the glass substrate and the gate electrode film, an n− amorphous Si semiconductor film that is formed on the silicon nitride film, an n+ amorphous Si ohmic film that is formed on the n− amorphous Si semiconductor film, a barrier film that includes a silicon oxide film formed on the n+ amorphous Si ohmic film, and a drain electrode film and a source electrode film that are formed on the barrier film including the silicon oxide film.

Each of the drain electrode film and the source electrode film includes a composite copper alloy film which includes: at least a copper alloy underlayer containing an oxygen-Ca (Al, Sn, Sb) concentrated layer that is formed so as to come into contact with the barrier film including the silicon oxide film; and a Cu alloy layer that is formed on the copper alloy underlayer containing an oxygen-Ca (Al, Sn, Sb) concentrated layer.

The copper alloy underlayer containing an oxygen-Ca (Al, Sn, Sb) concentrated layer is a copper alloy underlayer including a concentrated layer.

The concentrated layer includes 2 mol % to 30 mol % of Ca, 1 mol % to 10 mol % in total of one or more selected from the group consisting of Al, Sn, and Sb, 20 mol % to 50 mol % of oxygen, and as the remainder, Cu and inevitable impurities.

(4) In the thin-film transistor according to the second aspect of the present invention, the Cu alloy layer formed on the copper alloy underlayer containing an oxygen-Ca (Al, Sn, Sb) concentrated layer may include 0.05 mol % to 2 mol % in total of one or more selected from the group consisting of Al, Sn, and Sb, and as the remainder, Cu and inevitable impurities.

(5) An intermediate of a thin-film transistor according to the second aspect of the present invention includes a glass substrate, a gate electrode film that is formed on the glass substrate, a silicon nitride film that is formed on the glass substrate and the gate electrode film, an n− amorphous Si semiconductor film that is formed on the silicon nitride film, an n+ amorphous Si ohmic film that is formed on the n− amorphous Si semiconductor film, a barrier film includes a silicon oxide film formed on the n+ amorphous Si ohmic film, and a drain electrode film and a source electrode film that are formed on the barrier film including the silicon oxide film.

Each of the drain electrode film and the source electrode film includes a composite copper alloy film which includes: an oxygen-Ca (Al, Sn, Sb) copper alloy intermediate underlayer that is formed so as to come into contact with the barrier film including the silicon oxide film; and a Cu alloy layer that is formed on the oxygen-Ca (Al, Sn, Sb) copper alloy intermediate underlayer.

The oxygen-Ca (Al, Sn, Sb) copper alloy intermediate underlayer includes 0.2 mol % to 10 mol % of Ca, 0.05 mol % to 2 mol % in total of one or more selected from the group consisting Al, Sn, and Sb, 1 mol % to 20 mol % of oxygen, and as the remainder, Cu and inevitable impurities.

(6) In the intermediate of a thin-film transistor according to the second aspect of the present invention, the Cu alloy layer formed on the oxygen-Ca (Al, Sn, Sb) copper alloy intermediate underlayer may include 0.05 mol % to 2 mol % in total of one or more selected from the group consisting of Al, Sn, and Sb, and as the remainder, Cu and inevitable impurities.

Effects of the Invention

In the intermediate of a thin-film transistor according to the first aspect of the present invention, the silicon oxide ($SiO_x$) film is used as the barrier film. In addition, the composite copper alloy film is used as the drain electrode film and the source electrode film, and the composite copper alloy film includes the oxygen-calcium copper alloy underlayer containing oxygen and Ca and the Cu layer. Therefore, the adhesion of the drain electrode film and the source electrode film to the barrier film including the silicon oxide ($SiO_x$) film, is further improved. For example, even in the case where vibration is applied during the transfer of the intermediate of a thin-film transistor according to the first aspect, there is little possibility that a defect will occur due to the peeling-off of the drain electrode film and the source electrode film. In addition, it is possible to form the silicon oxide ($SiO_x$) film, which is the barrier film, by just performing pre-sputtering on the surface of the n$^+$ amorphous Si ohmic film 4'. As a result, it is possible to reduce manufacturing costs.

The thin-film transistor according to the first aspect of the present invention is obtained by performing a hydrogen plasma treatment on the intermediate of a thin-film transistor according to the first aspect, and the concentrated layer having high concentrations of Ca and oxygen is generated. Since the thin-film transistor includes the copper alloy underlayer containing an oxygen-calcium concentrated layer which includes the concentrated layer, adhesion to the barrier film including the silicon oxide ($SiO_x$) film, is further improved. Even in the case where strong vibration is applied to the thin-film transistor according to the first aspect, there is no possibility that a defect will occur in the thin-film transistor due to the peeling-off of the drain electrode film and the source electrode film.

In the intermediate of a thin-film transistor according to the second aspect of the present invention, the silicon oxide ($SiO_x$) film is used as the barrier film. In addition, the composite copper alloy film is used as the drain electrode film and the source electrode film, and the composite copper alloy film includes the oxygen-Ca (Al, Sn, Sb) copper alloy intermediate underlayer including Ca, Al, Sn, Sb, and oxygen and the Cu alloy layer. Therefore, the adhesion of the drain electrode film and the source electrode film to the barrier film, which is the silicon oxide ($SiO_x$) film, is further improved. For example, even in the case where vibration is applied during the transfer of the intermediate of a thin-film transistor according to the second aspect, there is little possibility that a defect will occur due to the peeling-off of the drain electrode film and the source electrode film. In addition, it is possible to form the silicon oxide ($SiO_x$) film, which is the barrier film, by just performing pre-sputtering on the surface of the n$^+$ amorphous Si ohmic film 4'. As a result, it is possible to reduce manufacturing costs.

The thin-film transistor according to the second aspect of the present invention is obtained by performing a hydrogen plasma treatment on the intermediate of a thin-film transistor according to the second aspect, and the concentrated layer having high concentrations of Ca, Al, Sn, Sb, and oxygen is generated. Since the thin-film transistor includes the copper alloy underlayer containing an oxygen-Ca (Al, Sn, Sb) concentrated layer which includes the concentrated layer, adhesion to the barrier film including the silicon oxide ($SiO_x$) film, is further improved. Even in the case where strong vibration is applied to the thin-film transistor according to the second aspect, there is no possibility that a defect will occur in the thin-film transistor due to the peeling-off of the drain electrode film and the source electrode film.

BEST MODE FOR CARRYING OUT THE INVENTION

Hereinafter, exemplary embodiments of the invention will be described with reference to the accompanying drawings.

First Embodiment

A first embodiment corresponds to the above-mentioned first aspect of the present invention.

A thin-film transistor and an intermediate of a thin-film transistor according to the first embodiment will be described in detail together with a method of manufacturing the same with reference to the drawings.

Figure 1:
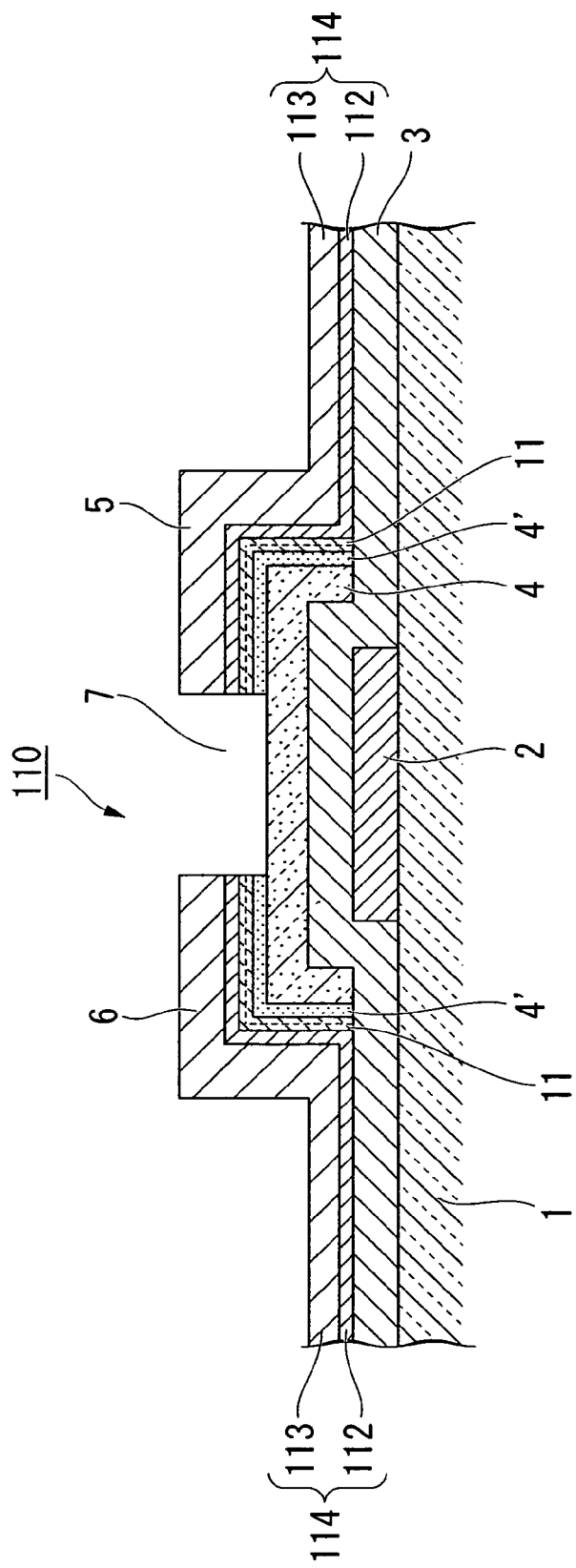
FIG. 1 is a cross-sectional view schematically illustrating an intermediate of a thin-film transistor according to a first aspect (embodiment) of the invention.
Figure 2:
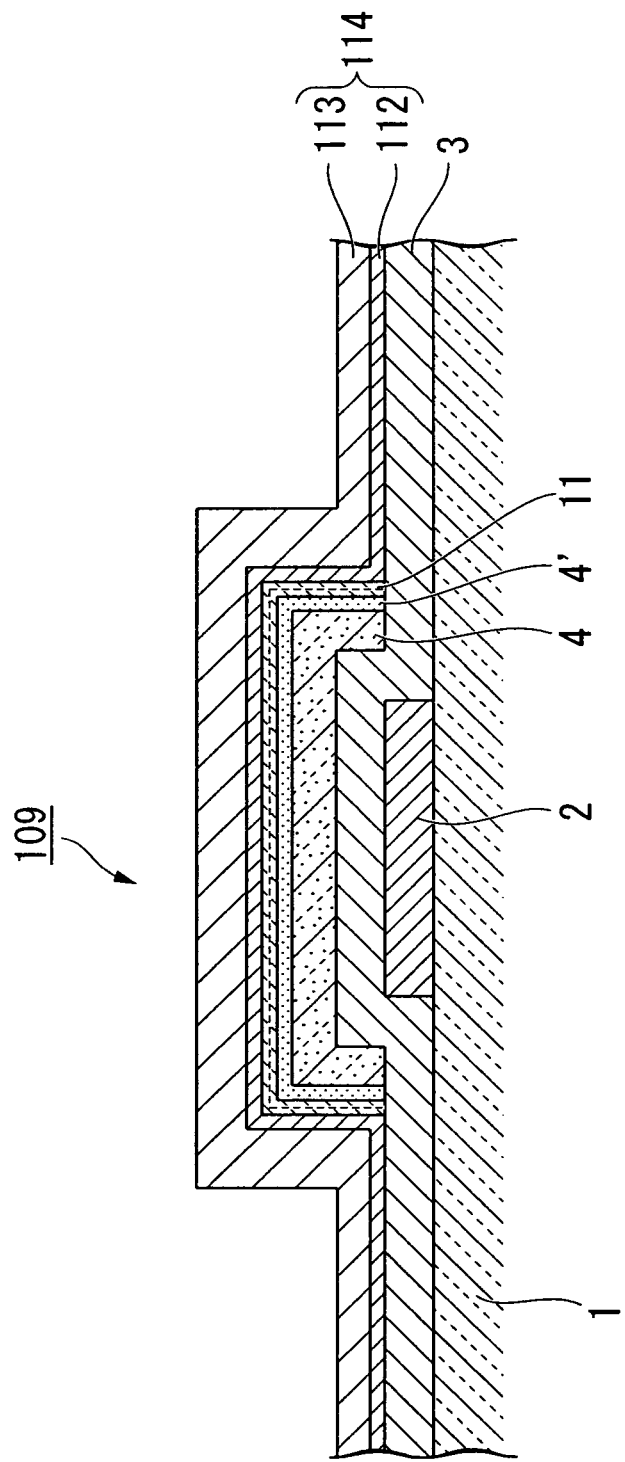
FIG. 2 is a cross-sectional view schematically illustrating a laminate for manufacturing the intermediate of a thin-film transistor according to the first aspect (embodiment) of the invention.

FIG. 1 is a cross-sectional view illustrating the intermediate of a thin-film transistor according to the first embodiment, and FIG. 2 is a cross-sectional view illustrating a laminate for manufacturing the intermediate of a thin-film transistor according to the first embodiment.

In order to manufacture the intermediate of a thin-film transistor according to the first embodiment shown in FIG. 1, at first, as shown in the cross-sectional view of FIG. 2, a gate electrode film 2 including a copper film is formed on the surface of a glass substrate 1, and a silicon nitride ($SiN_x$) film 3 is formed on the gate electrode film 2 and the glass substrate 1. Then an n$^-$ amorphous Si semiconductor film 4 is formed on the silicon nitride ($SiN_x$) film 3, and an n$^+$ amorphous Si ohmic film 4' is formed on the n$^-$ amorphous Si semiconductor film 4. A barrier film 11 including a silicon oxide ($SiO_x$) film is formed on the n$^+$ amorphous Si ohmic film 4'.

The barrier film 11 including a silicon oxide ($SiO_x$) film may be formed by a general PVD or CVD. However, the barrier film 11 may be formed by performing pre-sputtering while maintaining an oxygen atmosphere or an inert gas atmosphere including oxygen in a sputtering apparatus so as to oxidize the surface of the n$^+$ amorphous Si ohmic film 4'.

A composite copper alloy film 114 including a copper alloy underlayer containing oxygen and calcium 112 and a Cu layer 113 is formed on the barrier film 11. The copper alloy underlayer containing oxygen and calcium 112 has a component composition including Ca at a content within a range of 0.01 mol % to 10 mol % of Ca, oxygen at a content within a range of 1 mol % to 20 mol %, and Cu and inevitable impurities as the balance. In this way, a laminate 109 shown in FIG. 2 is manufactured.

The composite copper alloy film 114 including the copper alloy underlayer containing oxygen and calcium 112 and the Cu layer 113 is may be formed by the following method using a copper alloy target having a component composition including Ca at a content within a range of 0.01 mol % to 15 mol %, and Cu and inevitable impurities as the balance.

At first, sputtering is performed in an inert gas atmosphere including oxygen to form the copper alloy underlayer containing oxygen and calcium 112. Then, the supply of oxygen stops to change the atmosphere to an inert gas atmosphere. Thereafter, sputtering is performed in the inert gas atmosphere to form the Cu layer 113.

In the case where sputtering is performed in an inert gas atmosphere including oxygen using a copper alloy target having a component composition including Ca at a content within a range of 0.01 mol % to 15 mol %, and Cu and inevitable impurities as the balance, a copper alloy underlayer containing oxygen and calcium is formed which has a component composition including Ca at a content within a range of 0.01 mol % to 10 mol %, oxygen at a content within a range of 1 mol % to 20 mol %, and Cu and inevitable impurities as the balance.

Even in the case where sputtering is performed in an inert gas atmosphere using a copper alloy target having the same component composition as described above, a calcium-containing copper alloy film including Ca is not formed, but the Cu layer 113 having a component composition that does not include Ca and is close to pure copper is formed.

As such, since the Cu layer 113 is formed by sputtering using a copper alloy target including Ca at a content within a range of 0.01 mol % to 15 mol %, a very small amount of Ca is likely to be mixed with the Cu layer 113. However, the amount of Ca is very small, that is, equal to or less than 0.05 mol %, which is within a range of inevitable impurities. Therefore, the Cu layer 113 has substantially the same composition as copper.

In the laminate 109 shown in FIG. 2, wet etching is performed on a portion of the composite copper alloy film 114 immediately above the gate electrode 2, and plasma etching is performed on the barrier film 11 and the n$^+$ amorphous Si ohmic film 4'. Thereby, an isolation trench 7 is formed, and the n$^-$ amorphous Si semiconductor film 4 is exposed. In this way, a drain electrode film 5 and a source electrode film 6 are formed which include the composite copper alloy film 114 and are disposed on both sides of the isolation trench 7. By the above-mentioned process, it is possible to manufacture an intermediate of a thin-film transistor 110 according to the first embodiment shown in the cross-sectional view of FIG. 1.

By performing a hydrogen plasma treatment on the intermediate of a thin-film transistor 110 according to the first embodiment which has the isolation trench 7 subjected to plasma etching, the thin-film transistor according to the first embodiment can be manufactured.

The thin-film transistor according to the first embodiment is manufactured by performing the hydrogen plasma treatment so as to change the copper alloy underlayer containing oxygen and calcium 112 in the intermediate of a thin-film transistor 110 shown in FIG. 1 to a copper alloy underlayer containing an oxygen-calcium concentrated layer. Therefore, the cross-sectional structure configuration of the thin-film transistor is the same as that shown in FIG. 1. A description of the thin-film transistor according to the first embodiment with reference to the drawings will be omitted.

The hydrogen plasma treatment conditions of the intermediate of a thin-film transistor according to the first embodiment are the same as those described in the Background Art.

The hydrogen plasma treatment causes the copper alloy underlayer containing oxygen and calcium 112 having a component composition including Ca at a content within a range of 0.01 mol % to 10 mol %, oxygen at a content within a range of 1 mol % to 20 mol %, and Cu and inevitable impurities as the balance in the intermediate of a thin-film transistor according to the first embodiment to be changed into a copper alloy underlayer containing an oxygen-calcium concentrated layer (not shown) including a concentrated layer having a component composition in which the concentrations of Ca and oxygen are further high. The concentrated layer includes Ca at a content within a range of 2 mol % to 30 mol %, oxygen at a content within a range of 20 mol % to 50 mol %, and Cu and inevitable impurities as the balance.

When the copper alloy underlayer containing an oxygen-calcium concentrated layer is generated, the adhesion of the drain electrode film 5 and the source electrode film 6 to the barrier film in the thin-film transistor is significantly improved.

When the hydrogen plasma treatment is performed on the intermediate of a thin-film transistor according to the first embodiment which includes the copper alloy underlayer containing oxygen and calcium 112 having the above-mentioned component composition, the copper alloy underlayer containing an oxygen-calcium concentrated layer including the concentrated layer having the above-mentioned component composition in which the concentrations of Ca and oxygen are further high is generated. The reason is as follows. When the hydrogen plasma treatment is performed, Ca and oxygen included in the copper alloy underlayer containing oxygen and calcium 112 having the above-mentioned component composition are diffused and moved to the barrier film 11, and a concentrated layer having higher concentrations of Ca and oxygen is generated in the vicinity of the barrier film 11.

The generated copper alloy underlayer containing an oxygen-calcium concentrated layer includes the concentrated layer having a component composition including Ca at a content within a range of 2 mol % to 30 mol %, oxygen at a content within a range of 20 mol % to 50 mol %, and Cu and inevitable impurities as the balance, and the barrier film includes silicon oxide. It is considered that the reason why the adhesion of the generated copper alloy underlayer containing an oxygen-calcium concentrated layer to the barrier film is significantly high is as follows.

During the hydrogen plasma treatment, hydrogen is diffused into the copper alloy underlayer containing oxygen and calcium 112 having a component composition including Ca at a content within a range of 0.01 mol % to 10 mol %, oxygen at a content within a range of 1 mol % to 20 mol %, and Cu and inevitable impurities as the balance, and then hydrogen reacts with oxygen in the film to generate water. The water reacts with calcium oxide in the film to generate calcium hydroxide. Then, the calcium hydroxide becomes calcium ions and hydroxide ions, and the calcium ions and the hydroxide ions react with the barrier film which includes a silicon oxide film, to generate strong calcium silicate in a portion adjacent to the barrier film including a silicon oxide film. In this way, the adhesion of the copper alloy underlayer containing an oxygen-calcium concentrated layer to the barrier film is significantly improved.

The composite copper alloy film configures the drain electrode film and the source electrode film in the intermediate of a thin-film transistor according to the first embodiment, and the composite copper alloy film configures the drain electrode film and the source electrode film in the thin-film transistor according to the first embodiment. Next, the reasons why the component composition of the copper alloy underlayer containing oxygen and calcium in the composite copper alloy film in the intermediate of a thin-film transistor, and the component composition of the concentrated layer included in the copper alloy underlayer containing an oxygen-calcium concentrated layer in the composite copper alloy film in the thin-film transistor are limited as described above will be explained.

(1) Copper alloy underlayer containing oxygen and calcium in the intermediate of a thin-film transistor according to the first embodiment:

Since Ca and oxygen are included in the copper alloy underlayer containing oxygen and calcium in the composite copper alloy film that configures the drain electrode film and the source electrode film in the intermediate of a thin-film transistor according to the present embodiment, it is possible to improve adhesion to the barrier film including a silicon oxide ($SiO_x$) film.

However, in the case where the content of Ca is less than 0.01 mol %, or the content of oxygen is less than 1 mol %, the effect of preventing a reduction in adhesion during the hydrogen plasma treatment is insufficient, which is not preferable.

In order to contain more than 10 mol % of Ca, a copper alloy target including more than 15 mol % of Ca needs to be manufactured. Even when reactive sputtering in which oxygen is introduced is performed with a copper alloy target including more than 15 mol % of Ca, no discharge occurs at the beginning of sputtering. Therefore, it is difficult to effectively perform sputtering.

Here, a crack occurs in a copper alloy including more than 2.5 mol % of Ca during hot rolling; and thereby, it becomes difficult to manufacture a target. Therefore, it is preferable to manufacture a target including more than 2.5 mol % of Ca by performing hot pressing on Cu—Ca master alloy powder.

In the case where sputtering is performed in an inert gas atmosphere including more than 20% of oxygen, an abnormal discharge occurs. Therefore, it is difficult to form a copper alloy underlayer containing oxygen and calcium including more than 20 mol % of oxygen.

For these reasons, in the copper alloy underlayer containing oxygen and calcium that configures the composite copper alloy film in the intermediate of a thin-film transistor according to the first embodiment, the content of Ca is set to be within a range of 0.01 mol % to 10 mol % and the content of oxygen is set to be within a range of 1 mol % to 20 mol %.

In the intermediate of a thin-film transistor according to the first embodiment, it is considered that, in the case where a small amount of Ca is included in the copper alloy underlayer containing oxygen and calcium that configures the composite copper alloy film, the amount of Ca included in the copper alloy underlayer containing an oxygen-calcium concentrated layer in the thin-film transistor which is manufactured by the hydrogen plasma treatment is reduced and does not reach 2 mol %. However, in the intermediate of a thin-film transistor, it is confirmed that, in the case where a small amount of Ca is included in the copper alloy underlayer containing oxygen and calcium that configures the composite copper alloy film, it is possible to increase the amount of Ca to 2 mol % or more which is included in the concentrated layer in the copper alloy underlayer containing an oxygen-calcium concentrated layer of the manufactured thin-film transistor by further increasing the thickness of the copper alloy underlayer containing oxygen and calcium.

It is preferable that the thickness of the copper alloy underlayer containing oxygen and calcium be in a range of 10 nm to 100 nm. In this case, when a small amount of Ca is included in the copper alloy underlayer containing oxygen and calcium, it is possible to stabilize the amount of Ca included in the concentrated layer in the copper alloy underlayer containing an oxygen-calcium concentrated layer of the manufactured thin-film transistor in a range of 2 mol % to 30 mol %.

(2) Copper alloy underlayer containing an oxygen-calcium concentrated layer in the thin-film transistor according to the first embodiment:

When the hydrogen plasma treatment is performed on the intermediate of a thin-film transistor, the copper alloy underlayer containing oxygen and calcium 112 having the above-mentioned component composition in the intermediate of a thin-film transistor is changed so as to have a concentrated layer which has a component composition including Ca at a content within a range of 2 mol % to 30 mol %, oxygen at a content within a range of 20 mol % to 50 mol %, and Cu and inevitable impurities as the balance and has higher concentrations of Ca and oxygen.

When the copper alloy underlayer containing an oxygen-calcium concentrated layer including this concentrated layer having the component composition is generated, it is possible to further improve the adhesion of the drain electrode film and the source electrode film to the barrier film including a silicon oxide ($SiO_x$) film.

Second Embodiment

A second embodiment corresponds to the above-mentioned second aspect of the present invention.

A thin-film transistor and an intermediate of a thin-film transistor according to the second embodiment will be described in detail together with a method of manufacturing the same with reference to the drawings.

Figure 3:
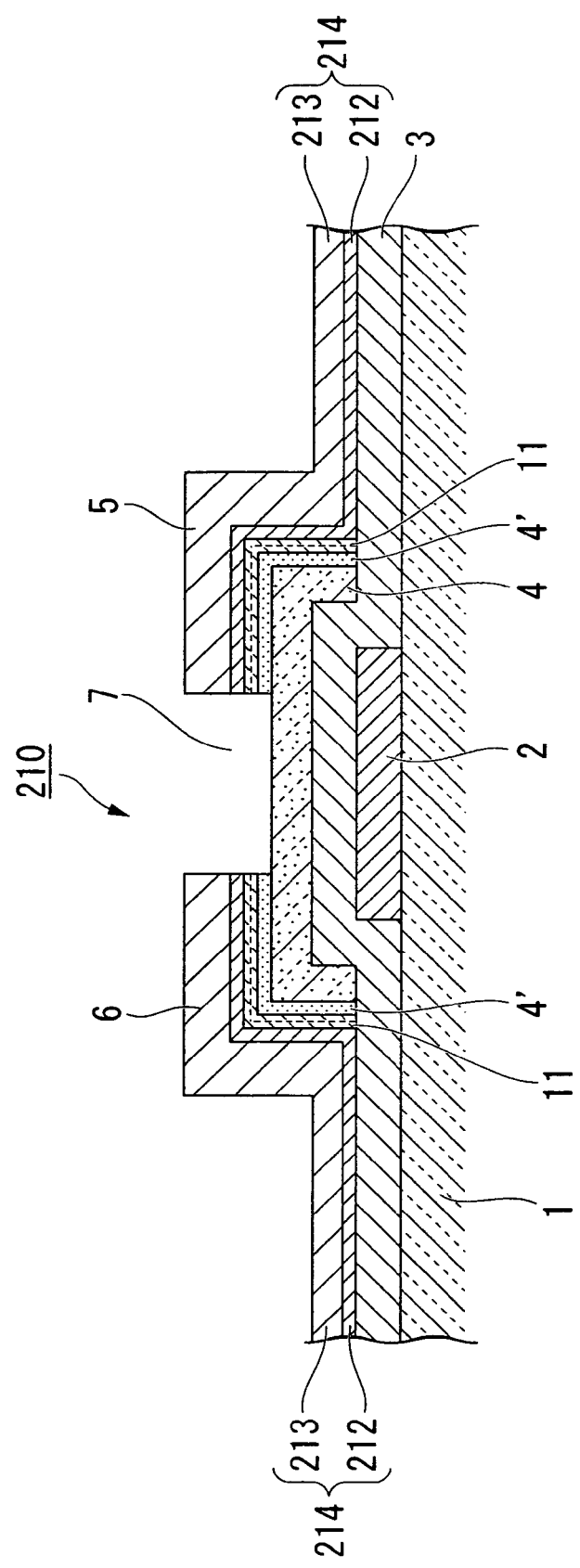
FIG. 3 is a cross-sectional view schematically illustrating an intermediate of a thin-film transistor according to a second aspect (embodiment) of the invention.
Figure 4:
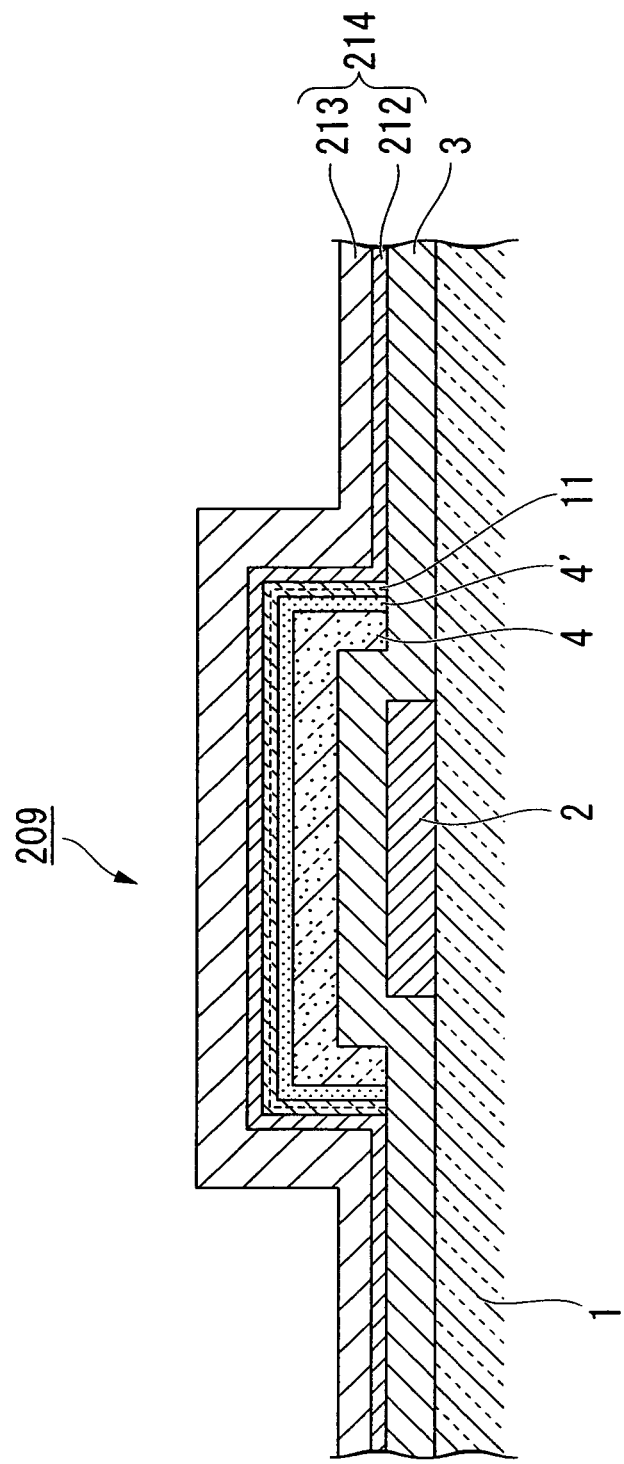
FIG. 4 is a cross-sectional view schematically illustrating a laminate for manufacturing the intermediate of a thin-film transistor according to the second aspect (embodiment) of the invention.
Figure 5:
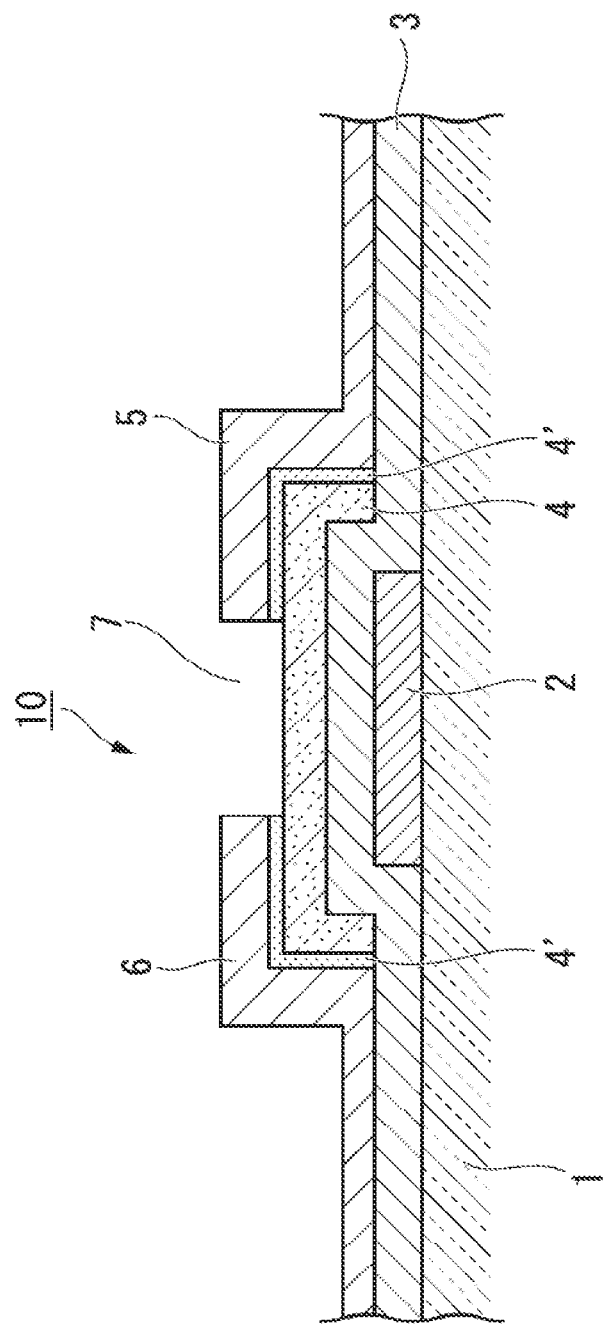
FIG. 5 is a cross-sectional view schematically illustrating an intermediate of a thin-film transistor according to the related art.
Figure 6:
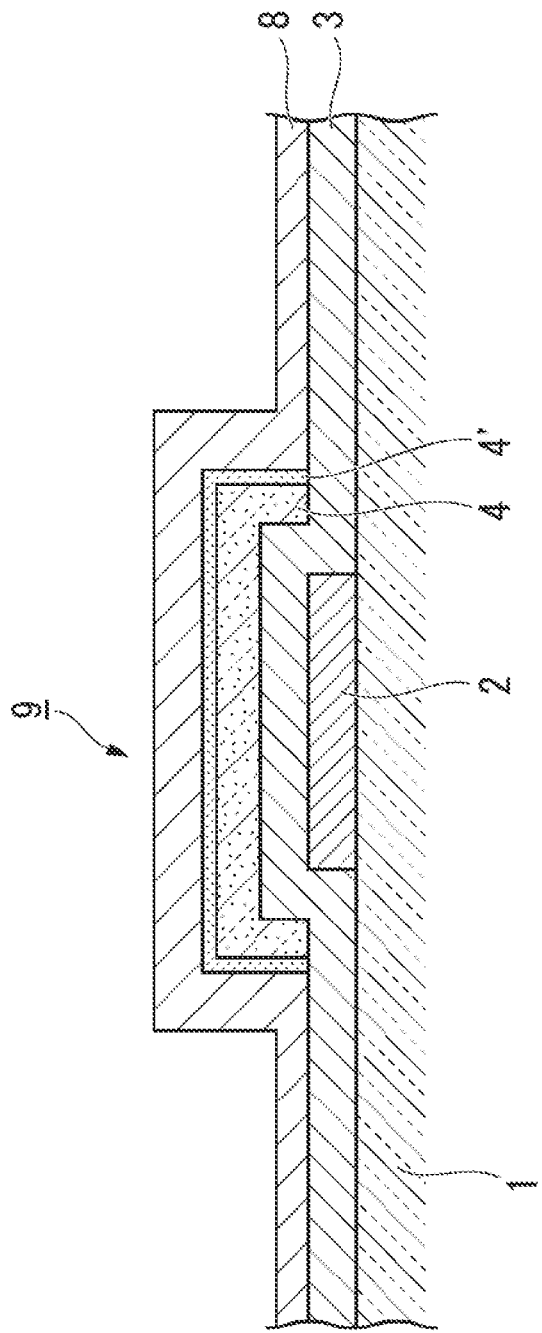
FIG. 6 is a cross-sectional view schematically illustrating a laminate for manufacturing the intermediate of a thin-film transistor according to the related art.

FIG. 3 is a cross-sectional view illustrating the intermediate of a thin-film transistor according to the second embodiment, and FIG. 4 is a cross-sectional view illustrating a laminate for manufacturing the intermediate of a thin-film transistor according to the second embodiment.

In order to manufacture the intermediate of a thin-film transistor according to the second embodiment shown in FIG. 3, at first, as shown in the cross-sectional view of FIG. 4, a gate electrode film 2 including a copper film is formed on the surface of a glass substrate 1, and a silicon nitride ($SiN_x$) film 3 is formed on the gate electrode film 2 and the glass substrate 1. Then an $n^-$ amorphous Si semiconductor film 4 is formed on the silicon nitride ($SiN_x$) film 3, and an $n^+$ amorphous Si ohmic film 4' is formed on the $n^-$ amorphous Si semiconductor film 4. Thereafter, a barrier film 11 including a silicon oxide ($SiO_x$) film is formed on the $n^+$ amorphous Si ohmic film 4'.

The barrier film 11 including a silicon oxide (SiO$_x$) film may be formed by general PVD or CVD. However, the barrier film 11 may be formed by performing pre-sputtering while maintaining an oxygen atmosphere or an inert gas atmosphere including oxygen in a sputtering apparatus so as to oxidize the surface of the n$^+$ amorphous Si ohmic film 4'.

A composite copper alloy film 214 including an oxygen-Ca (Al, Sn, Sb) copper alloy intermediate underlayer 212 and a Cu alloy layer 213 is formed on the barrier film 11. The oxygen-Ca (Al, Sn, Sb) copper alloy intermediate underlayer 212 has a component composition including Ca at a content within a range of 0.2 mol % to 10 mol %, one or more selected from the group consisting of Al, Sn, and Sb at a total content within a range of 0.05 mol % to 2 mol %, oxygen at a content within a range of 1 mol % to 20 mol %, and Cu and inevitable impurities as the balance. In this way, a laminate 209 shown in FIG. 4 is manufactured.

The composite copper alloy film 214 including the oxygen-Ca (Al, Sn, Sb) copper alloy intermediate underlayer 212 and the Cu alloy layer 213 may be formed by the following method using a copper alloy target having a component composition including Ca at a content within a range of 0.2 mol % to 15 mol %, one or more selected from the group consisting of Al, Sn, and Sb at a total content within a range of 0.1 mol % to 2 mol %, and Cu and inevitable impurities as the balance.

At first, sputtering is performed in an inert gas atmosphere including oxygen to form the oxygen-Ca (Al, Sn, Sb) copper alloy intermediate underlayer 212. Then, the supply of oxygen stops to change the atmosphere to an inert gas atmosphere without oxygen. Thereafter, sputtering is performed in the inert gas atmosphere without oxygen to form the Cu alloy layer 213.

In the case where sputtering is performed in an inert gas atmosphere including oxygen using a copper alloy target having a component composition including Ca at a content within a range of 0.2 mol % to 15 mol %, one or more selected from the group consisting of Al, Sn, and Sb at a total content within a range of 0.1 mol % to 2 mol %, and Cu and inevitable impurities as the balance, an oxygen-Ca (Al, Sn, Sb) copper alloy intermediate underlayer is formed which has a component composition including Ca at a content within a range of 0.2 mol % to 10 mol %, one or more selected from the group consisting of Al, Sn, and Sb at a total content within a range of 0.05 mol % to 2 mol %, oxygen at a content within a range of 1 mol % to 20 mol %, and Cu and inevitable impurities as the balance.

Even in the case where sputtering is performed in an inert gas atmosphere without oxygen using a copper alloy target having the same component composition as described above, a calcium-containing copper alloy film including Ca is not formed, which will be described below.

In the case where sputtering is performed in an inert gas atmosphere without oxygen using a copper alloy target including Ca at a content within a range of 0.2 mol % to 15 mol %, one or more selected from the group consisting of Al, Sn, and Sb at a total content within a range of 0.1 mol % to 2 mol %, and Cu and inevitable impurities as the balance, the Cu alloy layer 213 is formed.

A very small amount of Ca is likely to be mixed with the Cu alloy layer 213. However, the amount of Ca is very small, that is, equal to or less than 0.05 mol %, which is within the range of inevitable impurities. Therefore, in the case where the Cu alloy layer 213 is formed by performing sputtering in the inert gas atmosphere without oxygen using the copper alloy target including Ca at a content within a range of 0.2 mol % to 15 mol %, one or more selected from the group consisting of Al, Sn, and Sb at a total content within a range of 0.1 mol % to 2 mol %, and Cu and inevitable impurities as the balance, the Cu alloy layer 213 has a component composition including one or more selected from the group consisting of Al, Sn, and Sb at a total content within a range of 0.05 mol % to 2 mol %, and Cu and inevitable impurities as the balance.

In the laminate 209 shown in FIG. 4, wet etching is performed on a portion of the composite copper alloy film 214 immediately above the gate electrode 2, and plasma etching is performed on the barrier film 11 and the n$^+$ amorphous Si ohmic film 4'. Thereby, an isolation trench 7 is formed, and the n$^-$ amorphous Si semiconductor film 4 is exposed. In this way, a drain electrode film 5 and a source electrode film 6 are formed which include the composite copper alloy film 214 and are disposed on both sides of the isolation trench 7. By the above-mentioned process, it is possible to manufacture an intermediate of a thin-film transistor 210 according to the second embodiment shown in the cross-sectional view of FIG. 3.

By performing a hydrogen plasma treatment on the intermediate of a thin-film transistor 210 according to the second embodiment which has the isolation trench 7 subjected to plasma etching, the thin-film transistor according to the second embodiment can be manufactured.

The thin-film transistor according to the second embodiment is manufactured by performing the hydrogen plasma treatment so as to change the oxygen-Ca (Al, Sn, Sb) copper alloy intermediate underlayer 212 in the intermediate of a thin-film transistor 210 shown in FIG. 3 to a copper alloy underlayer containing an oxygen-calcium concentrated layer including a concentrated layer. Therefore, the cross-sectional structure configuration of the thin-film transistor is the same as that shown in FIG. 3. A description of the thin-film transistor according to the second embodiment with reference to the drawings will be omitted.

The hydrogen plasma treatment conditions of the intermediate of a thin-film transistor according to the second embodiment are the same as those described in the Background Art.

The hydrogen plasma treatment causes the oxygen-Ca (Al, Sn, Sb) copper alloy intermediate underlayer 212 having a component composition including Ca at a content within a range of 0.2 mol % to 10 mol %, one or more selected from the group consisting of Al, Sn, and Sb at a total content within a range of 0.05 mol % to 2 mol %, oxygen at a content within a range of 1 mol % to 20 mol %, and Cu and inevitable impurities as the balance in the intermediate of a thin-film transistor according to the second embodiment to be changed into a copper alloy underlayer containing an oxygen-Ca (Al, Sn, Sb) concentrated layer (not shown) including a concentrated layer having a component composition in which the concentrations of Ca, Al, Sn, Sb, and oxygen are further high. The concentrated layer includes Ca at a content within a range of 2 mol % to 30 mol %, one or more selected from the group consisting of Al, Sn, and Sb at a total content within a range of 1 mol % to 10 mol %, oxygen at a content within a range of 20 mol % to 50 mol %, and Cu and inevitable impurities as the balance.

When the copper alloy underlayer containing an oxygen-Ca (Al, Sn, Sb) concentrated layer is generated, the adhesion of the drain electrode film 5 and the source electrode film 6 to the barrier film in the thin-film transistor is significantly improved.

As described above, when the hydrogen plasma treatment is performed on the intermediate of a thin-film transistor according to the second embodiment which includes the oxygen-Ca (Al, Sn, Sb) copper alloy intermediate underlayer 212 having the above-mentioned component composition, the copper alloy underlayer containing an oxygen-Ca (Al, Sn, Sb) concentrated layer including the concentrated layer having the above-mentioned component composition in which the concentrations of Ca, Al, Sn, Sb, and oxygen are further high is generated. The reason is as follows. When the hydrogen plasma treatment is performed, Ca, Al, Sn, Sb, and oxygen included in the oxygen-Ca (Al, Sn, Sb) copper alloy intermediate underlayer 212 having the above-mentioned component composition are diffused and moved to the barrier film 11, and a concentrated layer having higher concentrations of Ca, Al, Sn, Sb, and oxygen is generated in the vicinity of the barrier film 11.

The generated copper alloy underlayer containing an oxygen-Ca (Al, Sn, Sb) concentrated layer includes the concentrated layer having a component composition including Ca at a content within a range of 2 mol % to 30 mol %, one or more selected from the group consisting of Al, Sn, and Sb at a total content within a range of 1 mol % to 10 mol %, oxygen at a content within a range of 20 mol % to 50 mol %, and Cu and inevitable impurities as the balance, and the barrier film includes silicon oxide. It is considered that the reason why the adhesion of the generated copper alloy underlayer containing an oxygen-Ca (Al, Sn, Sb) concentrated layer to the barrier film is significantly high is as follows.

During the hydrogen plasma treatment, hydrogen is diffused into the oxygen-Ca (Al, Sn, Sb) copper alloy intermediate underlayer 212 having a component composition including Ca at a content within a range of 0.2 mol % to 10 mol %, one or more selected from the group consisting of Al, Sn, and Sb at a total content within a range of 0.05 mol % to 2 mol %, oxygen at a content within a range of 1 mol % to 20 mol %, and Cu and inevitable impurities as the balance, and then hydrogen reacts with oxygen in the film to generate water. The water reacts with calcium oxide in the film to generate calcium hydroxide. Then, the calcium hydroxide becomes calcium ions and hydroxide ions, and the calcium ions and the hydroxide ions react with the barrier film which includes a silicon oxide film, to generate strong calcium silicate in a portion adjacent to the barrier film including a silicon oxide film. In this way, the adhesion of the generated copper alloy underlayer containing an oxygen-Ca (Al, Sn, Sb) concentrated layer to the barrier film is significantly improved.

Similarly, for Al, Sn, and Sb, water generated by the reaction between the diffused hydrogen and oxygen in the film reacts with Al oxide, Sn oxide, and Sb oxide in the film to generate Al hydroxide, Sn hydroxide, and Sb hydroxide, respectively. Then, the Al hydroxide, the Sn hydroxide, and the Sb hydroxide become Al ions, Sn ions, and Sb ions, and the Al ions, the Sn ions, and the Sb ions react with the barrier film which includes a silicon oxide film, to generate strong Al silicate, strong Sn silicate, and strong Sb silicate in a portion adjacent to the barrier film including a silicon oxide film. In this way, the adhesion of the generated copper alloy underlayer containing an oxygen-Ca (Al, Sn, Sb) concentrated layer to the barrier film is significantly improved.

The composite copper alloy film configures the drain electrode film and the source electrode film in the intermediate of a thin-film transistor according to the second embodiment, and the composite copper alloy film configures the drain electrode film and the source electrode film in the thin-film transistor according to the second embodiment. Next, the reason why the component composition of the oxygen-Ca (Al, Sn, Sb) copper alloy intermediate underlayer in the composite copper alloy film in the intermediate of a thin-film transistor, and the component composition of the concentrated layer included in the copper alloy underlayer containing an oxygen-Ca (Al, Sn, Sb) concentrated layer in the composite copper alloy film in the thin-film transistor are limited as described above will be explained.

(1) Oxygen-Ca (Al, Sn, Sb) copper alloy intermediate underlayer in the intermediate of a thin-film transistor according to the second embodiment:

Since Ca, Al, Sn, Sb, and oxygen are included in the oxygen-Ca (Al, Sn, Sb) copper alloy intermediate underlayer in the composite copper alloy film that configures the drain electrode film and the source electrode film in the intermediate of a thin-film transistor, it is possible to improve adhesion to the barrier film including a silicon oxide ($SiO_x$) film.

However, in the case where the content of Ca is less than 0.2 mol %, the total content of one or more selected from the group consisting of Al, Sn, and Sb is less than 0.05 mol %, or the content of oxygen is less than 1 mol %, the effect of preventing a reduction in adhesion during the hydrogen plasma treatment is insufficient, which is not preferable.

In order to contain more than 10 mol % of Ca, a copper alloy target including more than 15 mol % of Ca needs to be manufactured. Even when reactive sputtering in which oxygen is introduced is performed with a copper alloy target including more than 15 mol % of Ca, no discharge occurs at the beginning of sputtering. Therefore, it is difficult to effectively perform sputtering.

Here, a crack occurs in a copper alloy including more than 2.5 mol % of Ca during hot rolling; and thereby, it becomes difficult to manufacture a target. Therefore, it is preferable to manufacture a target including more than 2.5 mol % of Ca by performing hot pressing on Cu master alloy powder.

In the case where the total content of one or more selected from the group consisting of Al, Sn and Sb is more than 2 mol %, the resistance value of a formed Cu alloy film increases, and it is not preferable to use the Cu alloy film as the drain electrode film and the source electrode film.

In the case where sputtering is performed in an inert gas atmosphere including more than 20% of oxygen, an abnormal discharge occurs. Therefore, it is difficult to form an oxygen-Ca (Al, Sn, Sb) copper alloy intermediate underlayer including more than 20 mol % of oxygen.

For these reasons, in the oxygen-Ca (Al, Sn, Sb) copper alloy intermediate underlayer that configures the composite copper alloy film in the intermediate of a thin-film transistor according to the second embodiment, the content of Ca is set to be within a range of 0.2 mol % to 10 mol %, the total content of one or more selected from the group consisting of Al, Sn and Sb is set to be within a range of 0.05 mol % to 2 mol %, and the content of oxygen is set to be within a range of 1 mol % to 20 mol %.

(2) Copper alloy underlayer containing an oxygen-Ca (Al, Sn, Sb) concentrated layer in the thin-film transistor according to the second embodiment:

When the hydrogen plasma treatment is performed on the intermediate of a thin-film transistor, the oxygen-Ca (Al, Sn, Sb) copper alloy intermediate underlayer 212 having the above-mentioned component composition in the intermediate of a thin-film transistor is changed so as to have a concentrated layer which has a component composition including Ca at a content within a range of 2 mol % to 30 mol %, one or more selected from the group consisting of Al, Sn, and Sb at a total content within a range of 1 mol % to 10 mol %, oxygen at a content within a range of 20 mol % to 50 mol %, and Cu and inevitable impurities as the balance and has higher concentrations of Ca, Al, Sn, Sb, and oxygen, during the hydrogen plasma treatment.

When the copper alloy underlayer containing an oxygen-Ca (Al, Sn, Sb) concentrated layer including this concentrated layer having the component composition is generated, it is possible to further improve adhesion to the barrier film including a silicon oxide ($SiO_x$) film.

EXAMPLE 1

An oxygen-free copper with a purity of 99.99 mass % was prepared, and the oxygen-free copper was melted in a high-purity graphite mold in an Ar gas atmosphere by high-frequency induction heating. Ca was added and melted into the obtained molten copper so as to obtain molten metals having component compositions shown in Table 1.

The obtained molten metals were molded with a cooled carbon mold, and hot rolling was performed on the molds. Finally, stress-relief annealing was performed on the molds.

The surface of the obtained rolled bodies were processed by a lathe machine so as to manufacture targets 1A to 1O that had an outside diameter of 152 mm and a thickness of 5 mm and had the component compositions shown in Table 1. In addition, a pure copper target 1P was manufactured from an oxygen-free copper with a purity of 99.999 mass %.

TABLE 1

| Classification | | Component composition (mol %) | |
|---|---|---|---|
| | | Ca | Cu |
| Target | 1A | 0.01 | Balance |
| | 1B | 0.05 | Balance |
| | 1C | 0.1 | Balance |
| | 1D | 0.2 | Balance |
| | 1E | 0.25 | Balance |
| | 1F | 0.3 | Balance |
| | 1G | 0.5 | Balance |
| | 1H | 0.8 | Balance |
| | 1I | 1.0 | Balance |
| | 1J | 1.2 | Balance |
| | 1K | 1.5 | Balance |
| | 1L | 1.7 | Balance |
| | 1M | 2.0 | Balance |
| | 1N | 2.5 | Balance |
| | 1O | 0.005 | Balance |
| | 1P | Oxygen-free copper of 4N | |

A substrate was placed in a sputtering apparatus, and the substrate included a glass plate ("1737" glass plate manufactured by Corning Incorporated with a length of 50 mm, a width of 50 mm, and a thickness of 0.7 mm) and an $n^+$ amorphous Si film with a thickness of 100 nm which was formed on the surface of the glass plate. In addition, any one of the targets 1A to 1P was placed in the sputtering apparatus such that the distance between the substrate and the targets was 70 mm. A DC power supply was used as a power supply for the sputtering apparatus, and a vacuum chamber of the sputtering apparatus was evacuated to a vacuum of $4 \times 10^{-5}$ Pa.

Then, an oxygen-Ar mixed gas including oxygen at a ratio shown in Tables 2 and 3 was flowed as a sputtering gas into the vacuum chamber to set the sputtering atmosphere pressure to be 0.67 Pa. Thereafter, discharge (pre-sputtering) was performed with an output of 600 W for one minute under conditions where a shutter was closed; and thereby, a silicon oxide film with a thickness of about 10 nm was formed on the surface of the $n^+$ amorphous Si film.

Then, the shutter was opened, and discharge was performed with an output of 600 W to form copper alloy underlayers containing oxygen and calcium having thicknesses and component compositions shown in Tables 2 and 3. Thereafter, the supply of oxygen was stopped and sputtering was performed at a pressure of 0.67 Pa only in an Ar gas atmosphere to form a Cu layer that had a thickness of 250 nm and included Cu and inevitable impurities.

In this way, composite copper alloy films 101 to 114 for an intermediate of a thin-film transistor according to examples of the invention, composite copper alloy films 101 to 103 for an intermediate of a thin-film transistor according to comparative examples, and a composite copper alloy film 101 for an intermediate of a thin-film transistor according to the related art were formed.

The cross cut adhesion test was performed on the obtained composite copper alloy films for an intermediate of a thin-film transistor under the following conditions.

Cross Cut Adhesion Test:

A cutter was used to make 11-by-11 cuts in the surface of the composite copper alloy film for an intermediate of a thin-film transistor at intervals of 1 mm on the basis of JIS-K5400; and thereby, 100 cell films (square films) were formed. A Scotch tape manufactured by 3M was adhered and taken away from the surface at once. Then, the number of cell films peeling off among the cell films adhered to a central area of 10 mm by 10 mm of the glass substrate was measured.

The obtained results are shown in the field "the number of cells peeling off (cells/100)" in Tables 2 and 3. The results were used to evaluate adhesion properties to the glass substrate.

The contents of Ca and oxygen included in the copper alloy underlayer containing oxygen and calcium of the composite copper alloy film for an intermediate of a thin-film transistor were analyzed by a scanning auger electron spectroscopy analyzer (Model: PHI700 manufactured by Ulvac-Phi, Incorporated) under the following conditions.

(Electron Gun)
  Acceleration voltage: 5 kV
  Emission current: 10 nA (measured by Faraday cup)
  Beam diameter: 10 μm (diameter)
(Ion Gun)
  Acceleration voltage: 1 kV
  Emission current: 10 mA
  Raster width: 1×1 mm
(Sample Stage)
  Inclination: 30°
  Rotation: Zalar
  Rotational speed: 0.8 rpm
(Analysis Conditions)
  Sputtering mode: Alternating W/Zalar
  Sputtering interval: 1 minute

TABLE 2

| Composite copper alloy film for intermediate of thin-film transistor | | Used target in Table 1 | Amount of oxygen included in oxygen-Ar mixed sputtering gas (vol %) | Copper alloy underlayer containing oxygen and calcium in composite copper alloy film for intermediate of thin-film transistor | | | | Number of cells peeling off (cells/100) | Remarks |
|---|---|---|---|---|---|---|---|---|---|
| | | | | Component composition (mol %) | | | Thickness (nm) | | |
| | | | | Oxygen | Ca | Cu | | | |
| Example of the | 101 | 1A | 10 | 10 | 0.01 | Balance | 200 | 0 | — |
| | 102 | 1B | 10 | 10 | 0.05 | Balance | 150 | 0 | — |

TABLE 2-continued

| Composite copper alloy film for intermediate of thin-film transistor | | Used target in Table 1 | Amount of oxygen included in oxygen-Ar mixed sputtering gas (vol %) | Copper alloy underlayer containing oxygen and calcium in composite copper alloy film for intermediate of thin-film transistor | | | Thickness (nm) | Number of cells peeling off (cells/100) | Remarks |
|---|---|---|---|---|---|---|---|---|---|
| | | | | Component composition (mol %) | | | | | |
| | | | | Oxygen | Ca | Cu | | | |
| invention | 103 | 1C | 15 | 15 | 0.1 | Balance | 100 | 0 | — |
| | 104 | 1D | 1 | 1 | 0.2 | Balance | 70 | 0 | — |
| | 105 | 1E | 7 | 8 | 0.24 | Balance | 70 | 0 | — |
| | 106 | 1F | 10 | 11 | 0.28 | Balance | 50 | 0 | — |
| | 107 | 1G | 16 | 15 | 0.5 | Balance | 60 | 0 | — |
| | 108 | 1H | 3 | 4 | 0.7 | Balance | 50 | 0 | — |
| | 109 | 1I | 14 | 12 | 1.0 | Balance | 50 | 0 | — |
| | 110 | 1J | 18 | 20 | 1.1 | Balance | 50 | 0 | — |
| | 111 | 1K | 5 | 8 | 1.3 | Balance | 50 | 0 | — |
| | 112 | 1L | 20 | 20 | 1.5 | Balance | 50 | 0 | — |
| | 113 | 1M | 10 | 11 | 1.8 | Balance | 40 | 0 | — |
| | 114 | 1N | 10 | 10 | 2.0 | Balance | 50 | 0 | — |

TABLE 3

| Composite copper alloy film for intermediate of thin-film transistor | | Used target in Table 1 | Amount of oxygen included in oxygen-Ar mixed sputtering gas (vol %) | Copper alloy underlayer containing oxygen and calcium of composite copper alloy film for intermediate of thin-film transistor | | | Thickness (nm) | Number of cells peeling off (cells/100) | Remarks |
|---|---|---|---|---|---|---|---|---|---|
| | | | | Component composition (mol %) | | | | | |
| | | | | Oxygen | Ca | Cu | | | |
| Comparative example | 101 | 1O | 10 | 10 | 0.005* | Balance | 150 | 10 | — |
| | 102 | 1G | 0.5 | 0.5* | 0.5 | Balance | 100 | 25 | — |
| | 103 | 1G | 25 | 21* | 0.5 | Balance | 50 | — | Abnormal discharge occurred during deposition |
| Related art | 101 | 1P | 10 | 10 | — | Balance | 50 | 100 | — |

(*indicates a value outside the range of the invention)

As can be seen from the result shown in Tables 2 and 3, the composite copper alloy films 101 to 114 for an intermediate of a thin-film transistor according to the example of the invention have adhesion properties more excellent than that of the composite copper alloy film 101 for an intermediate of a thin-film transistor according to the related art.

The composite copper alloy films 101 to 102 for an intermediate of a thin-film transistor according to the comparative examples having values outside the ranges of the conditions of the first embodiment have low adhesion properties, which is not preferable.

When the composite copper alloy film 103 for an intermediate of a thin-film transistor according to the comparative example was formed, discharge was unstable and an abnormal discharge occurred. It is considered that this is because the concentration of oxygen included in the oxygen-Ar mixed sputtering gas was 25 vol % and an oxide film was formed on the surface of the target. The occurrence of the abnormal discharge caused discharge to stop plural times. However, at that time, discharge was resumed so as to form a composite copper alloy film with a predetermined thickness. As in the composite copper alloy film 103 for an intermediate of a thin-film transistor according to the comparative example, abnormal discharge occurred during the deposition of the copper alloy underlayer containing oxygen and calcium including more than 20 mol % of oxygen. Therefore, it was difficult to stably form the copper alloy underlayer containing oxygen and calcium.

EXAMPLE 2

The composite copper alloy films 101 to 114 for an intermediate of a thin-film transistor according to the examples of the invention, the composite copper alloy films 101 to 102 for an intermediate of a thin-film transistor according to the comparative examples, and the composite copper alloy film 101 for an intermediate of a thin-film transistor according to the related art shown in Tables 2 and 3 which could be formed were subjected to a hydrogen plasma treatment under the following conditions. In this way, composite copper alloy films 101 to 114 for a thin-film transistor according to the examples of the invention, composite copper alloy films 101 to 102 for a thin-film transistor according to the comparative examples, and a composite copper alloy film 101 for a thin-film transistor according to the related art were manufactured. These composite copper alloy films for a thin-film transistor each included a Cu layer and a copper alloy underlayer containing an oxygen-calcium concentrated layer including a concentrated layer having a component composition shown in Tables 4 and 5.

(Hydrogen Plasma Treatment Conditions)
Gas: 100% hydrogen gas
Hydrogen gas flow rate: 500 SCCM
Hydrogen gas pressure: 100 Pa
Process temperature: 300° C.
RF power current density: 0.1 W/cm$^2$
Process time: 2 minutes The specific resistance values of these composite copper alloy films for a thin-film transistor were measured by a four probe method. The cross cut adhesion test was performed under the same conditions as those in Example 1.

The obtained results are shown in Tables 4 and 5. The composite copper alloy films for a thin-film transistor were evaluated.

The contents of Ca and oxygen in the concentrated layer included in the copper alloy underlayer containing an oxygen-calcium concentrated layer of the composite copper alloy film for a thin-film transistor were analyzed under the same conditions as those in Example 1.

resistance and the adhesion properties deteriorated. Therefore, the composite copper alloy films 101 to 102 for a thin-film transistor were not preferable as the electrode film of the thin-film transistor.

EXAMPLE 3

After evacuation, an Ar gas was introduced into a high-frequency melting furnace to change the atmosphere to an Ar gas atmosphere, and copper and calcium were melted by the

TABLE 4

| Composite copper alloy film for thin-film transistor | | Composite copper alloy film for intermediate of thin-film transistor in Table 2 | | Component composition of concentrated layer included in copper alloy underlayer containing oxygen-calcium concentrated layer generated by hydrogen plasma treatment (mol %) | | | Specific resistance ($\mu\Omega$cm) | Number of cells peeling off (cells/100) |
|---|---|---|---|---|---|---|---|---|
| | | | | Oxygen | Ca | Cu | | |
| Example of the invention | 101 | Example of the invention | 101 | 20 | 2 | Balance | 2.3 | 0 |
| | 102 | | 102 | 21 | 2 | Balance | 2.3 | 0 |
| | 103 | | 103 | 25 | 2 | Balance | 2.1 | 0 |
| | 104 | | 104 | 25 | 2 | Balance | 2.1 | 0 |
| | 105 | | 105 | 40 | 4 | Balance | 2.2 | 0 |
| | 106 | | 106 | 30 | 5 | Balance | 2.1 | 0 |
| | 107 | | 107 | 40 | 8 | Balance | 2.2 | 0 |
| | 108 | | 108 | 20 | 7 | Balance | 2.3 | 0 |
| | 109 | | 109 | 30 | 10 | Balance | 2.2 | 0 |
| | 110 | | 110 | 50 | 12 | Balance | 2.1 | 0 |
| | 111 | | 111 | 40 | 14 | Balance | 2.4 | 0 |
| | 112 | | 112 | 50 | 18 | Balance | 2.2 | 0 |
| | 113 | | 113 | 40 | 19 | Balance | 2.2 | 0 |
| | 114 | | 114 | 30 | 20 | Balance | 2.1 | 0 |

TABLE 5

| Composite copper alloy film for thin-film transistor | | Composite copper alloy film for intermediate of thin-film transistor in Table 3 | | Component composition of concentrated layer included in copper alloy underlayer containing oxygen-calcium concentrated layer generated by hydrogen plasma treatment (mol %) | | | Specific resistance ($\mu\Omega$cm) | Number of cells peeling off (cells/100) |
|---|---|---|---|---|---|---|---|---|
| | | | | Oxygen | Ca | Cu | | |
| Comparative example | 101 | Comparative example | 101 | 40 | 1.8* | Balance | 2.3 | 10 |
| | 102 | | 102 | 19* | 9 | Balance | 2.3 | 15 |
| Related art | 101 | Related art | 101 | 10 | — | Balance | 2.1 | 100 |

(*indicates a value outside the range of the invention)

As can be seen from the result shown in Tables 4 and 5, the specific resistances of the composite copper alloy films 101 to 114 for a thin-film transistor according to the examples of the invention were almost same as that of the composite copper alloy film 101 for a thin-film transistor according to the related art, and there was no great difference between the specific resistances. However, the adhesion properties of the composite copper alloy films 101 to 114 for a thin-film transistor according to the examples of the invention were considerably higher than that of the composite copper alloy film 101 for a thin-film transistor according to the related art. Therefore, with regard to the thin-film transistor according to the first embodiment which includes the electrode film including any one of the composite copper alloy films 101 to 114 for a thin-film transistor according to the examples of the invention, it can be understood that the possibility to occur defects due to the peeling-off of the electrode film is significantly reduced.

With regard to the composite copper alloy films 101 to 102 for a thin-film transistor according to the comparative examples which had values outside the ranges of the conditions of the first embodiment, at least one of the specific high-frequency melting furnace and molded to manufacture Cu—Ca master alloy ingots containing different amounts of Ca. The Cu—Ca master alloy ingots containing different amounts of Ca were melted again to obtain molten metals, and the obtained molten metals were each subjected to gas-atomizing in an Ar gas flow at a pressure of 3 MPa while maintaining the temperature at 1250° C. to produce Cu—Ca master alloy powders having component compositions shown in Table 6.

The obtained Cu—Ca master alloy powders were classified to produce Cu—Ca master alloy powders with a maximum particle diameter of 100 μm or less. Then, the Cu—Ca master alloy powders were each filled in a graphite mold having a mold release agent coated thereon, and hot pressing was performed under conditions where a temperature was 800° C., a pressure was 15 MPa, and a retention time was 30 minutes; and thereby, hot-pressed bodies were manufactured.

A machining process was performed on the hot-pressed bodies to manufacture targets 1a to 1n having the component compositions shown in Table 6.

TABLE 6

| Classification | | Component composition of Cu—Ca master alloy powder (mol %) | | Component composition of target (mol %) | |
|---|---|---|---|---|---|
| | | Ca | Cu | Ca | Cu |
| Target | 1a | 3 | Balance | 2.6 | Balance |
| | 1b | 4 | Balance | 3.5 | Balance |
| | 1c | 5 | Balance | 4.0 | Balance |
| | 1d | 6 | Balance | 5.0 | Balance |
| | 1e | 7 | Balance | 5.5 | Balance |
| | 1f | 8 | Balance | 6.0 | Balance |
| | 1g | 9 | Balance | 7.0 | Balance |
| | 1h | 10 | Balance | 8.0 | Balance |
| | 1i | 11 | Balance | 9.0 | Balance |
| | 1j | 12 | Balance | 10.0 | Balance |
| | 1k | 13 | Balance | 11.0 | Balance |
| | 1l | 14 | Balance | 11.5 | Balance |
| | 1m | 15 | Balance | 12.0 | Balance |
| | 1n | 16 | Balance | 13.0 | Balance |

A substrate was placed in a sputtering apparatus, and the substrate included a glass plate ("1737" glass plate manufactured by Corning Incorporated with a length of 50 mm, a width of 50 mm, and a thickness of 0.7 mm) and an n$^+$ amorphous Si film with a thickness of 100 nm which was formed on the surface of the glass plate. In addition, any one of the targets 1a to 1n shown in Table 6 was placed in the sputtering apparatus such that the distance between the substrate and the targets was 70 mm. A DC power supply was used as a power supply for the sputtering apparatus, and a vacuum chamber of the sputtering apparatus was evacuated to a vacuum of $4\times10^{-5}$ Pa.

Then, an oxygen-Ar mixed gas including oxygen at the ratio shown in Table 7 was flowed as a sputtering gas into the vacuum chamber to set the sputtering atmosphere pressure to be 0.67 Pa. Thereafter, discharge (pre-sputtering) was performed with an output of 600 W for one minute under condition where a shutter was closed; and thereby, a silicon oxide film with a thickness of about 10 nm was formed on the surface of the n$^+$ amorphous Si film.

Then, the shutter was opened and discharge was performed with an output of 600 W to form a copper alloy underlayer containing oxygen and calcium having a thickness of 50 nm and component compositions shown in Table 7. Thereafter, the supply of oxygen was stopped and sputtering was performed at a pressure of 0.67 Pa only in an Ar gas atmosphere to form a Cu layer that had a thickness of 250 nm and included Cu and inevitable impurities.

In this way, composite copper alloy films 115 to 127 for an intermediate of a thin-film transistor according to the examples of the invention were formed. In the comparative example 104, the target 1n including more than 15 mol % of Ca shown in Table 6 was used to attempt to form a film. However, discharge did not occur at the beginning of sputtering. Therefore, it was difficult to form the composite copper alloy film 104 for an intermediate of a thin-film transistor according to the comparative example.

The cross cut adhesion test was performed on the obtained composite copper alloy films for an intermediate of a thin-film transistor under the same conditions as those in Example 1. The obtained results are shown in the field "the number of cells peeling off (cells/100)" in Table 7 and were used to evaluate adhesion properties to the glass substrate.

The contents of Ca and oxygen included in the copper alloy underlayer containing oxygen and calcium of the composite copper alloy films 115 to 127 for an intermediate of a thin-film transistor according to the examples of the invention were analyzed by a scanning auger electron spectroscopy analyzer (Model: PHI700 manufactured by Ulvac-Phi, Incorporated) under the same conditions as those in Example 1.

TABLE 7

| Composite copper alloy film for intermediate of thin-film transistor | | Used target in Table 6 | Amount of oxygen included in oxygen-Ar mixed sputtering gas (vol %) | Copper alloy underlayer containing oxygen and calcium in composite copper alloy film for intermediate of thin-film transistor | | | | Number of cells peeling off (cells/100) | Remarks |
|---|---|---|---|---|---|---|---|---|---|
| | | | | Component composition (mol %) | | | Thickness | | |
| | | | | Oxygen | Ca | Cu | (nm) | | |
| Example of the invention | 115 | 1a | 1 | 1 | 2.1 | Balance | 50 | 0 | — |
| | 116 | 1b | 5 | 5 | 2.9 | Balance | 50 | 0 | — |
| | 117 | 1c | 10 | 11 | 3.5 | Balance | 50 | 0 | — |
| | 118 | 1d | 15 | 14 | 4.0 | Balance | 50 | 0 | — |
| | 119 | 1e | 20 | 18 | 4.3 | Balance | 50 | 0 | — |
| | 120 | 1f | 1 | 1 | 4.5 | Balance | 50 | 0 | — |
| | 121 | 1g | 5 | 6 | 5.5 | Balance | 50 | 0 | — |
| | 122 | 1h | 10 | 11 | 6.5 | Balance | 20 | 0 | — |
| | 123 | 1i | 15 | 16 | 7 | Balance | 50 | 0 | — |
| | 124 | 1j | 20 | 20 | 8 | Balance | 40 | 0 | — |
| | 125 | 1k | 10 | 10 | 8.5 | Balance | 40 | 0 | — |
| | 126 | 1l | 10 | 11 | 9 | Balance | 30 | 0 | — |
| | 127 | 1m | 10 | 10 | 10 | Balance | 20 | 0 | — |
| Comparative Example 104 | | 1n | 10 | Film was not formed since discharge did not occur at the beginning of sputtering | | | | | | |

As can be seen from the result shown in Table 7, the adhesion properties of the composite copper alloy films 115 to 127 for an intermediate of a thin-film transistor according to the examples of the invention were higher than that of the composite copper alloy film 101 for an intermediate of a thin-film transistor according to the related art shown in Table 3.

EXAMPLE 4

The composite copper alloy films 115 to 127 for an intermediate of a thin-film transistor according to the example of the invention shown in Table 7, which could be formed, were subjected to a hydrogen plasma treatment under the same conditions as those in Example 2. In this way, composite copper alloy films 115 to 127 for a thin-film transistor according to the examples of the invention were manufactured.

These composite copper alloy films for a thin-film transistor each included a Cu layer and a copper alloy underlayer containing an oxygen-calcium concentrated layer including a concentrated layer having a component composition shown in Table 8.

The specific resistance values of these composite copper alloy films for a thin-film transistor were measured by a four probe method. The cross cut adhesion test was performed under the same conditions as those in Example 1.

The obtained result is shown in Table 8. The composite copper alloy films for a thin-film transistor were evaluated.

The contents of Ca and oxygen in the concentrated layer included in the composite copper alloy film for a thin-film transistor were analyzed under the same conditions as those in Example 1.

The surface of the obtained rolled bodies were processed by a lathe machine so as to manufacture targets 2A to 2M that had an outside diameter of 152 mm and a thickness of 6 mm and had the component composition shown in Table 9. In addition, a pure copper target 2N was manufactured from an oxygen-free copper with a purity of 99.99 mass %.

TABLE 9

| Classification | | Component composition (mol %) | | | | |
|---|---|---|---|---|---|---|
| | | Ca | Al | Sn | Sb | Cu |
| Target | 2A | 0.2 | 0.07 | — | — | Balance |
| | 2B | 0.25 | 0.3 | — | — | Balance |

TABLE 8

| Composite copper alloy film for thin-film transistor | Composite copper alloy film for intermediate of thin-film transistor in Table 7 | Component composition of concentrated layer included in copper alloy underlayer containing oxygen-calcium concentrated layer generated by hydrogen plasma treatment (mol %) | | | Specific resistance (μΩcm) | Number of cells peeling off (cells/100) |
|---|---|---|---|---|---|---|
| | | Oxygen | Ca | Cu | | |
| Example of the invention | 115 | Example of the invention | 115 | 20 | 10 | Balance | 2.3 | 0 |
| | 116 | | 116 | 30 | 15 | Balance | 2.2 | 0 |
| | 117 | | 117 | 35 | 12 | Balance | 2.2 | 0 |
| | 118 | | 118 | 40 | 8 | Balance | 2.4 | 0 |
| | 119 | | 119 | 50 | 15 | Balance | 2.2 | 0 |
| | 120 | | 120 | 25 | 20 | Balance | 2.3 | 0 |
| | 121 | | 121 | 20 | 25 | Balance | 2.5 | 0 |
| | 122 | | 122 | 30 | 20 | Balance | 2.4 | 0 |
| | 123 | | 123 | 35 | 25 | Balance | 2.2 | 0 |
| | 124 | | 124 | 45 | 25 | Balance | 2.2 | 0 |
| | 125 | | 125 | 30 | 22 | Balance | 2.5 | 0 |
| | 126 | | 126 | 35 | 25 | Balance | 2.6 | 0 |
| | 127 | | 127 | 25 | 30 | Balance | 2.4 | 0 |

As can be seen from the result shown in Table 8, the specific resistances of the composite copper alloy films 115 to 127 for a thin-film transistor according to the examples of the invention were almost same as that of the composite copper alloy film 101 for a thin-film transistor according to the related art shown in Table 5, and there was no great difference between the specific resistances. However, the adhesion properties of the composite copper alloy films 115 to 127 for a thin-film transistor according to the examples of the invention were considerably higher than that of the composite copper alloy film 101 for a thin-film transistor according to the related art. Therefore, with regard to the thin-film transistor according to the first embodiment of the invention which includes the electrode film including any one of the composite copper alloy films 115 to 127 for a thin-film transistor according to the examples of the invention, it can be understood that the possibility to occur defects due to the peeling-off of the electrode film is significantly reduced.

EXAMPLE 5

An oxygen-free copper with a purity of 99.99 mass % was prepared, and the oxygen-free copper was melted in a high-purity graphite mold in an Ar gas atmosphere by high-frequency induction heating. Ca and one or more selected from the group consisting of Al, Sn, and Sb were added and melted into the obtained molten copper so as to obtain molten metals having component compositions shown in Table 9.

The obtained molten metals were molded with a cooled carbon mold and hot rolling was performed on the molds. Finally, stress-relief annealing was performed on the molds.

TABLE 9-continued

| Classification | Component composition (mol %) | | | | |
|---|---|---|---|---|---|
| | Ca | Al | Sn | Sb | Cu |
| 2C | 0.3 | 2.2 | — | — | Balance |
| 2D | 0.5 | — | 0.07 | — | Balance |
| 2E | 0.8 | — | 0.4 | — | Balance |
| 2F | 1.0 | — | 2.5 | — | Balance |
| 2G | 1.2 | — | — | 0.09 | Balance |
| 2H | 1.5 | — | — | 0.4 | Balance |
| 2I | 1.7 | — | — | 2.2 | Balance |
| 2J | 2.0 | 0.1 | 0.1 | — | Balance |
| 2K | 2.5 | 0.2 | — | 0.3 | Balance |
| 2L | 0.15 | — | 0.9 | 0.8 | Balance |
| 2M | 0.15 | 0.1 | 0.1 | 0.1 | Balance |
| 2N | Oxygen-free copper of 4N | | | | |

A substrate was placed in a sputtering apparatus, and the substrate included a glass plate ("1737" glass plate manufactured by Corning Incorporated with a length of 50 mm, a width of 50 mm, and a thickness of 0.7 mm) and an n+ amorphous Si film with a thickness of 100 nm which was formed on the surface of the glass plate. In addition, any one of the targets 2A to 2M was placed in the sputtering apparatus such that the distance between the substrate and the targets was 70 mm. A DC power supply was used as a power supply for the sputtering apparatus and a vacuum chamber of the sputtering apparatus was evacuated to a vacuum of $4\times10^{-5}$ Pa.

Then, an oxygen-Ar mixed gas including oxygen at a ratio shown in Table 10 was flowed as a sputtering gas into the vacuum chamber to set the sputtering atmosphere pressure to be 0.67 Pa. Thereafter, discharge (pre-sputtering) was performed with an output of 600 W for one minute under conditions where a shutter was closed; and thereby, a silicon oxide film with a thickness of about 10 nm was formed on the surface of the n+ amorphous Si film.

Then, the shutter was opened, and discharge was performed with an output of 600 W to form oxygen-Ca (Al, Sn, Sb) copper alloy intermediate underlayers having a thickness of 50 nm and component compositions shown in Table 10. Thereafter, the supply of oxygen was stopped and sputtering was performed at a pressure of 0.67 Pa only in an Ar gas atmosphere to form a Cu layer that had a thickness of 250 nm and included Cu and inevitable impurities.

In this way, composite copper alloy films 201 to 212 for an intermediate of a thin-film transistor according to the examples of the invention, composite copper alloy films 201 to 203 for an intermediate of a thin-film transistor according to a comparative examples, and a composite copper alloy film 201 for an intermediate of a thin-film transistor according to the related art were formed.

The cross cut adhesion test was performed on the obtained composite copper alloy films for an intermediate of a thin-film transistor under the same conditions as those in Example 1.

The obtained results are shown in the field "the number of cells peeling off (cells/100)" in Table 10 and were used to evaluate adhesion properties to the glass substrate.

The contents of Ca, Al, Sn, Sb, and oxygen included in the oxygen-Ca (Al, Sn, Sb) copper alloy intermediate underlayer of each of the composite copper alloy films for an intermediate of a thin-film transistor were analyzed by a scanning auger electron spectroscopy analyzer (Model: PHI700 manufactured by Ulvac-Phi, Incorporated) under the same conditions as those in Example 1.

examples having values outside the ranges of the conditions of the second embodiment have low adhesion properties, which is not preferable.

When the composite copper alloy film 203 for an intermediate of a thin-film transistor according to the comparative example was formed, discharge was unstable and abnormal discharge occurred. It is considered that this is because the concentration of oxygen included in the oxygen-Ar mixed sputtering gas was 25 vol % and an oxide film was formed on the surface of the target. The occurrence of the abnormal discharge caused discharge to stop plural times. However, at that time, discharge was resumed so as to form a composite copper alloy film with a predetermined thickness. As in the composite copper alloy film 203 for an intermediate of a thin-film transistor according to the comparative example, abnormal discharge occurred during the deposition of the oxygen-Ca (Al, Sn, Sb) copper alloy intermediate underlayer including more than 20 mol % of oxygen. Therefore, it was difficult to stably form the oxygen-Ca (Al, Sn, Sb) copper alloy intermediate underlayer

EXAMPLE 6

The composite copper alloy films 201 to 212 for an intermediate of a thin-film transistor according to the examples of the invention, the composite copper alloy films 201 and 202 for an intermediate of a thin-film transistor according to the comparative examples, and the composite copper alloy film 201 for an intermediate of a thin-film transistor according to the related art shown in Table 10 which could be formed were subjected to a hydrogen plasma treatment under the same conditions as those in Example 2. In this way, composite copper alloy films 201 to 212 for a thin-film transistor according to the examples of the invention, composite copper alloy

TABLE 10

| Composite copper alloy film for intermediate of thin-film transistor | | Used target in Table 9 | Amount of oxygen included in oxygen-Ar mixed sputtering gas (vol %) | Component composition of oxygen-Ca (Al, Sn, Sb) copper alloy intermediate underlayer in composite copper alloy film for intermediate of thin-film transistor (mol %) | | | | | Number of cells peeling off (cells/100) | Remarks |
|---|---|---|---|---|---|---|---|---|---|---|
| | | | | Oxygen | Ca | Al | Sn | Sb | Cu | | |
| Example of the invention | 201 | 2A | 1 | 1 | 0.2 | 0.05 | — | — | Balance | 0 | — |
| | 202 | 2B | 5 | 4 | 0.2 | 0.2 | — | — | Balance | 0 | — |
| | 203 | 2C | 5 | 5 | 0.2 | 2 | — | — | Balance | 0 | — |
| | 204 | 2D | 8 | 8 | 0.4 | — | 0.05 | — | Balance | 0 | — |
| | 205 | 2E | 10 | 10 | 0.7 | — | 0.3 | — | Balance | 0 | — |
| | 206 | 2F | 10 | 10 | 0.8 | — | 2 | — | Balance | 0 | — |
| | 207 | 2G | 10 | 10 | 0.9 | — | — | 0.05 | Balance | 0 | — |
| | 208 | 2H | 10 | 10 | 1.2 | — | — | 0.4 | Balance | 0 | — |
| | 209 | 2I | 15 | 14 | 1.4 | — | — | 2 | Balance | 0 | — |
| | 210 | 2J | 17 | 17 | 1.6 | 0.05 | 0.05 | — | Balance | 0 | — |
| | 211 | 2K | 18 | 19 | 2.0 | 0.1 | — | 0.2 | Balance | 0 | — |
| | 212 | 2L | 20 | 20 | 0.2 | — | 0.8 | 0.7 | Balance | 0 | |
| Comparative example | 201 | 2M | 10 | 10 | 0.12* | 0.05 | 0.05 | 0.08 | Balance | 10 | — |
| | 202 | 2D | 0.5 | 0.5* | 0.5 | — | 0.05 | — | Balance | 25 | — |
| | 203 | 2D | 25 | 21* | 0.5 | — | 0.05 | — | Balance | — | Abnormal discharge occurred during deposition |
| Related art 201 | | 2n | 10 | 10 | — | — | — | — | — | 100 | — |

As can be seen from the result shown in Table 10, the composite copper alloy films 201 to 212 for an intermediate of a thin-film transistor according to the examples of the invention have adhesion properties more excellent than that of the composite copper alloy film 201 for an intermediate of a thin-film transistor according to the related art.

The composite copper alloy films 201 to 212 for an intermediate of a thin-film transistor according to the comparative films 201 and 202 for a thin-film transistor according to the comparative examples, and a composite copper alloy film 201 for a thin-film transistor according to the related art were manufactured. These composite copper alloy films for a thin-film transistor each included a copper alloy underlayer containing an oxygen-Ca (Al, Sn, Sb) concentrated layer including a concentrated layer having a component composition shown in Table 11.

The specific resistance values of these composite copper alloy films for a thin-film transistor were measured by a four probe method. The cross cut adhesion test was performed under the same conditions as those in Example 1.

The obtained result is shown in Table 11. The composite copper alloy films for a thin-film transistor were evaluated.

The contents of Ca, Al, Sn, Sb, and oxygen in the concentrated layer included in the copper alloy underlayer containing an oxygen-Ca (Al, Sn, Sb) concentrated layer of the composite copper alloy film for a thin-film transistor were analyzed under the same conditions as those in Example 1.

examples which had values outside the ranges of the conditions of the second embodiment, at least one of the specific resistance and the adhesion properties deteriorated. Therefore, the composite copper alloy films 201 and 202 for a thin-film transistor were not preferable as the electrode film of the thin-film transistor.

EXAMPLE 7

After evacuation, an Ar gas was introduced into a high-frequency melting furnace to change the atmosphere to an Ar gas atmosphere, and copper, calcium, aluminum, tin, and

TABLE 11

| Composite copper alloy film for thin-film transistor | | Composite copper alloy film for intermediate of thin-film transistor in Table 10 | | Component composition of concentrated layer included in copper alloy underlayer containing oxygen-Ca (Al, Sn, Sb) concentrated layer generated by hydrogen plasma treatment (mol %) | | | | | | Specific resistance ($\mu\Omega$cm) | Number of cells peeling off (cells/100) |
|---|---|---|---|---|---|---|---|---|---|---|---|
| | | | | Oxygen | Ca | Al | Sn | Sb | Cu | | |
| Example of the invention | 201 | Example of the invention | 201 | 20 | 2 | 1 | — | — | Balance | 2.2 | 0 |
| | 202 | | 202 | 25 | 2 | 5 | — | — | Balance | 2.3 | 0 |
| | 203 | | 203 | 25 | 2 | 10 | — | — | Balance | 2.2 | 0 |
| | 204 | | 204 | 30 | 4 | — | 1 | — | Balance | 2.4 | 0 |
| | 205 | | 205 | 30 | 9 | — | 5 | — | Balance | 2.2 | 0 |
| | 206 | | 206 | 30 | 8 | — | 10 | — | Balance | 2.3 | 0 |
| | 207 | | 207 | 30 | 15 | — | — | 1 | Balance | 2.4 | 0 |
| | 208 | | 208 | 30 | 15 | — | — | 5 | Balance | 2.2 | 0 |
| | 209 | | 209 | 30 | 18 | — | — | 10 | Balance | 2.2 | 0 |
| | 210 | | 210 | 45 | 17 | 1 | 1 | — | Balance | 2.2 | 0 |
| | 211 | | 211 | 45 | 20 | 5 | — | 3 | Balance | 2.3 | 0 |
| | 212 | | 212 | 50 | 2 | — | 6 | 4 | Balance | 2.4 | 0 |
| Comparative example | 201 | Comparative example | 201 | 40 | 1.8* | 1 | 1 | 1 | Balance | 2.2 | 10 |
| | 202 | | 202 | 19* | 9 | — | 1 | — | Balance | 2.3 | 15 |
| Related art 201 | | Related art 201 | | 10 | | — | 1 | — | Balance | 2.4 | 100 |

(*indicates a value outside the range of the invention)

As can be seen from the result shown in Table 11, the specific resistances of the composite copper alloy films 201 to 212 for a thin-film transistor according to the examples of the invention were almost same as that of the composite copper alloy film 201 for a thin-film transistor according to the related art, and there was no great difference between the specific resistances. However, the adhesion properties of the composite copper alloy films 201 to 212 for a thin-film transistor according to the examples of the invention were considerably higher than that of the composite copper alloy film 201 for a thin-film transistor according to the related art. Therefore, with regard to the thin-film transistor according to the second embodiment of the invention which includes the electrode film including any one of the composite copper alloy films 201 to 212 for a thin-film transistor according to the examples of the invention, it can be understood that the possibility to occur defects due to the peeling-off of the electrode film is significantly reduced.

With regard to the composite copper alloy films 201 and 202 for a thin-film transistor according to the comparative antimony were melted by the high-frequency melting furnace and molded to manufacture Cu master alloy ingots containing different amounts of Ca, Al, Sn, and Sb. The Cu master alloy ingots containing different amounts of Ca, Al, Sn, and Sb were melted again to obtain molten metals, and the obtained molten metals were each subjected to gas-atomizing in an Ar gas flow at a pressure of 3 MPa while maintaining the temperature at 1250° C. to produce Cu master alloy powders having component compositions shown in Table 12.

The obtained Cu master alloy powders were classified to produce Cu master alloy powder with a maximum particle diameter of 100 µm or less. Then, the Cu master alloy powders were each filled in a graphite mold having a mold release agent coated thereon, and hot pressing was performed under the conditions where a temperature was 800° C., a pressure was 15 MPa, and a retention time was 30 minutes; and thereby, hot-pressed bodies were manufactured.

A machining process was performed on the hot-pressed bodies to manufacture targets 2a to 2n having the component compositions shown in Table 12.

TABLE 12

| Classification | | Component composition of Cu—Ca master alloy powder (mol %) | | | | | Component composition of target (mol %) | | | | |
|---|---|---|---|---|---|---|---|---|---|---|---|
| | | Ca | Al | Sn | Sb | Cu | Ca | Al | Sn | Sb | Cu |
| Target | 2a | 3.0 | 0.1 | — | — | Balance | 2.6 | 0.07 | — | — | Balance |
| | 2b | 3.7 | 0.5 | — | — | Balance | 3.5 | 0.4 | — | — | Balance |
| | 2c | 4.0 | 2.5 | — | — | Balance | 4.0 | 2.2 | — | — | Balance |
| | 2d | 5.5 | — | 0.09 | — | Balance | 5.0 | — | 0.07 | — | Balance |
| | 2e | 5.7 | — | 0.5 | — | Balance | 5.5 | — | 0.4 | — | Balance |
| | 2f | 6.5 | — | 2.7 | — | Balance | 6.0 | — | 2.5 | — | Balance |
| | 2g | 7.5 | — | — | 0.1 | Balance | 7.0 | — | — | 0.08 | Balance |
| | 2h | 8.5 | — | — | 0.5 | Balance | 8.0 | — | — | 0.3 | Balance |
| | 2i | 9.3 | — | — | 2.9 | Balance | 9.0 | — | — | 2.4 | Balance |
| | 2j | 10.0 | 0.1 | 0.1 | — | Balance | 10.0 | 0.07 | 0.08 | — | Balance |
| | 2k | 11.5 | 0.2 | — | 0.2 | Balance | 11.0 | 0.15 | — | 0.15 | Balance |
| | 2l | 13.0 | — | 0.3 | 0.4 | Balance | 12.5 | — | 0.2 | 0.3 | Balance |
| | 2m | 15.0 | 0.1 | 0.1 | 0.1 | Balance | 14.5 | 0.07 | 0.05 | 0.05 | Balance |
| | 2n | 17.0 | — | — | — | Balance | 16.0 | — | — | — | Balance |

A substrate was placed in a sputtering apparatus, and the substrate included a glass plate ("1737" glass plate manufactured by Corning Incorporated with a length of 50 mm, a width of 50 mm, and a thickness of 0.7 mm) and an n$^+$ amorphous Si film with a thickness of 100 nm which was formed on the surface of the glass plate. In addition, any one of the targets 2a to 2n shown in Table 12 was placed in the sputtering apparatus such that the distance between the substrate and the targets was 70 mm. A DC power supply was used as a power supply for the sputtering apparatus, and a vacuum chamber of the sputtering apparatus was evacuated to a vacuum of $4 \times 10^{-5}$ Pa.

Then, an oxygen-Ar mixed gas including oxygen at the ratio shown in Table 13 was flowed as a sputtering gas into the vacuum chamber to set the sputtering atmosphere pressure to be 0.67 Pa. Thereafter, discharge (pre-sputtering) was performed with an output of 600 W for one minute under condition where a shutter was closed; and thereby, a silicon oxide film with a thickness of about 10 nm was formed on the surface of the n$^+$ amorphous Si film.

Then, the shutter was opened and discharge was performed with an output of 600 W to form an oxygen-Ca (Al, Sn, Sb) copper alloy intermediate underlayer having a thickness of 50 nm and component compositions shown in Table 13. Thereafter, the supply of oxygen was stopped and sputtering was performed at a pressure of 0.67 Pa only in an Ar gas atmosphere to form a Cu layer that had a thickness of 250 nm and included Cu and inevitable impurities.

In this way, composite copper alloy films 212 to 224 for an intermediate of a thin-film transistor according to the examples of the invention were formed. In the comparative example 204, the target 2n including more than 15 mol % of Ca shown in Table 12 was used to attempt to form a film. However, discharge did not occur at the beginning of sputtering. Therefore, it was difficult to form the composite copper alloy film 204 for an intermediate of a thin-film transistor according to the comparative example.

The cross cut adhesion test was performed on the obtained composite copper alloy films for an intermediate of a thin-film transistor under the same conditions as those in Example 1. The obtained results are shown in the field "the number of cells peeling off (cells/100)" in Table 13 and were used to evaluate adhesion properties to the glass substrate.

The contents of Ca, Al, Sn, Sb, and oxygen included in the oxygen-Ca (Al, Sn, Sb) copper alloy intermediate underlayer of each of the composite copper alloy films 212 to 224 for an intermediate of a thin-film transistor according to the examples of the invention were analyzed by a scanning auger electron spectroscopy analyzer (Model: PHI700 manufactured by Ulvac-Phi, Incorporated) under the same conditions as those in Example 1.

TABLE 13

| Composite copper alloy film for intermediate of thin-film transistor | | Used target in Table 12 | Amount of oxygen included in oxygen-Ar mixed sputtering gas (vol %) | Oxygen-Ca (Al, Sn, Sb) copper alloy intermediate underlayer in composite copper alloy film for intermediate of thin-film transistor (mol %) | | | | | | Number of cells peeling off (cells/100) | Remarks |
|---|---|---|---|---|---|---|---|---|---|---|---|
| | | | | Oxygen | Ca | Al | Sn | Sb | Cu | | |
| Example of the invention | 212 | 2a | 1 | 1 | 2.0 | 0.05 | — | — | Balance | 0 | — |
| | 213 | 2b | 5 | 4 | 3.1 | 1 | — | — | Balance | 0 | — |
| | 214 | 2c | 5 | 5 | 3.5 | 2 | — | — | Balance | 0 | — |
| | 215 | 2d | 10 | 9 | 4.0 | — | 0.05 | — | Balance | 0 | — |
| | 216 | 2e | 10 | 8 | 4.5 | — | 1.1 | — | Balance | 0 | — |
| | 217 | 2f | 10 | 10 | 5.0 | — | 2 | — | Balance | 0 | — |
| | 218 | 2g | 10 | 10 | 6.5 | — | — | 0.06 | Balance | 0 | — |
| | 219 | 2h | 10 | 8 | 7.5 | — | — | 0.9 | Balance | 0 | — |
| | 220 | 2i | 10 | 9 | 8 | — | — | 1.9 | Balance | 0 | — |
| | 221 | 2j | 10 | 10 | 9 | 0.05 | 0.05 | — | Balance | 0 | — |
| | 222 | 2k | 15 | 12 | 8 | 0.1 | — | 0.1 | Balance | 0 | — |
| | 223 | 2l | 15 | 14 | 9 | — | 0.15 | 0.2 | Balance | 0 | — |
| | 224 | 2m | 20 | 20 | 10 | 0.05 | 0.05 | 0.05 | Balance | 0 | — |
| Comparative example 204 | | 2n | Film was not formed since discharge did not occur at the beginning of sputtering | | | | | | | | | |

As can be seen from the results shown in Table 13, the composite copper alloy films 212 to 224 for an intermediate of a thin-film transistor according to the examples of the invention had adhesion properties higher than that of the composite copper alloy film 201 for an intermediate of a thin-film transistor according to the related art shown in Table 10.

EXAMPLE 8

The composite copper alloy films 212 to 224 for an intermediate of a thin-film transistor according to the examples of the invention shown in Table 13, which could be formed, were subjected to a hydrogen plasma treatment under the same conditions as those in Example 2. In this way, composite copper alloy films 212 to 224 for a thin-film transistor according to the examples of the invention were manufactured. These composite copper alloy films for a thin-film transistor each included a Cu alloy layer and a copper alloy underlayer containing an oxygen-Ca (Al, Sn, Sb) concentrated layer including a concentrated layer having a component composition shown in Table 14.

The specific resistance values of these composite copper alloy films for a thin-film transistor were measured by a four probe method. The cross cut adhesion test was performed under the same conditions as those in Example 1.

The obtained result is shown in Table 11. The composite copper alloy films for a thin-film transistor were evaluated.

The contents of Ca, Al, Sn, Sb, and oxygen in the concentrated layer included in each of the composite copper alloy films for a thin-film transistor were analyzed under the same conditions as those in Example 1.

composite copper alloy films 212 to 224 for a thin-film transistor according to the examples of the invention, it can be understood that the possibility to occur defects due to the peeling-off of the electrode film is significantly reduced.

INDUSTRIAL APPLICABILITY

In the thin-film transistor and the intermediate of a thin-film transistor according to the invention, the drain electrode film and the source electrode film have high adhesion properties. Therefore, even in the case where vibration is applied during transfer, there is little possibility that a defect will occur due to the peeling-off of the drain electrode film and the source electrode film. Therefore, the invention can be applied to a thin-film transistor used in, for example, a flat panel display or an intermediate of a thin-film transistor thereof.

Brief Description of Symbols

| | |
|---|---|
| 1: | glass substrate |
| 2: | gate electrode |
| 3: | $SiN_x$ film |
| 4: | $n^+$ amorphous Si ohmic film |
| 4': | $n^-$ amorphous Si semiconductor film |
| 5: | drain electrode |
| 6: | source electrode |
| 7: | isolation trench |
| 8: | pure copper film |
| 9: | laminate for manufacturing intermediate of thin-film transistor according to related art |
| 10: | intermediate of a thin-film transistor according to related art |
| 11: | barrier film |

TABLE 14

| Composite copper alloy film for thin-film transistor | | Composite copper alloy film for intermediate of thin-film transistor in Table 13 | | Component composition of concentrated layer included in copper alloy underlayer containing oxygen-Ca (Al, Sn, Sb) concentrated layer generated by hydrogen plasma treatment (mol %) | | | | | Specific resistance ($\mu\Omega$cm) | Number of cells peeling off (cells/100) |
|---|---|---|---|---|---|---|---|---|---|---|
| | | | | Oxygen | Ca | Al | Sn | Sb | Cu | | |
| Example of the invention | 212 | Example of the invention | 212 | 20 | 20 | 1 | — | — | Balance | 2.2 | 0 |
| | 213 | | 213 | 26 | 21 | 5 | — | — | Balance | 2.3 | 0 |
| | 214 | | 214 | 26 | 25 | 10 | — | — | Balance | 2.2 | 0 |
| | 215 | | 215 | 30 | 24 | — | 1 | — | Balance | 2.4 | 0 |
| | 216 | | 216 | 30 | 28 | — | 6 | — | Balance | 2.3 | 0 |
| | 217 | | 217 | 32 | 25 | — | 10 | — | Balance | 2.2 | 0 |
| | 218 | | 218 | 33 | 24 | — | — | 1 | Balance | 2.4 | 0 |
| | 219 | | 219 | 32 | 25 | — | — | 5 | Balance | 2.3 | 0 |
| | 220 | | 220 | 30 | 25 | — | — | 9 | Balance | 2.2 | 0 |
| | 221 | | 221 | 32 | 29 | 1 | 1 | — | Balance | 2.1 | 0 |
| | 222 | | 222 | 35 | 28 | 5 | — | 5 | Balance | 2.5 | 0 |
| | 223 | | 223 | 40 | 30 | — | 5 | 4 | Balance | 2.4 | 0 |
| | 224 | | 224 | 50 | 30 | 1 | 1 | 1 | Balance | 2.1 | 0 |

As can be seen from the result shown in Table 14, the specific resistances of the composite copper alloy films 212 to 224 for a thin-film transistor according to the examples of the invention were almost same as that of the composite copper alloy film 201 for a thin-film transistor according to the related art shown in Table 11, and there was no great difference between the specific resistances. However, the adhesion properties of the composite copper alloy films 212 to 224 for a thin-film transistor according to the examples of the invention were considerably higher than that of the composite copper alloy film 201 for a thin-film transistor according to the related art. Therefore, with regard to the thin-film transistor according to the second embodiment of the invention which includes the electrode film including any one of the -continued Brief Description of Symbols

| | |
|---|---|
| 109: | laminate for manufacturing intermediate of thin-film transistor according to first aspect (embodiment) |
| 110: | intermediate of thin-film transistor according to first aspect (embodiment) |
| 112: | copper alloy underlayer containing oxygen and calcium according to first aspect (embodiment) |
| 113: | Cu layer according to first aspect (embodiment) |
| 114: | composite copper alloy film according to first aspect (embodiment) |
| 209: | laminate for manufacturing intermediate of thin-film transistor according to second aspect (embodiment) |

| Brief Description of Symbols | |
|---|---|
| 210: | intermediate of thin-film transistor according to second aspect (embodiment) |
| 212: | oxygen-Ca (Al, Sn, Sb) copper alloy intermediate underlayer according to second aspect (embodiment) |
| 213: | Cu alloy layer according to second aspect (embodiment) |
| 214: | composite copper alloy film according to second aspect (embodiment) |

The invention claimed is:

1. A thin-film transistor comprising:
a glass substrate;
a gate electrode film that is formed on the glass substrate;
a silicon nitride film that is formed on the glass substrate and the gate electrode film;
an n⁻ amorphous Si semiconductor film that is formed on the silicon nitride film;
an n⁺ amorphous Si ohmic film that is formed on the n⁻ amorphous Si semiconductor film;
a barrier film that comprises a silicon oxide film formed on the n⁺ amorphous Si ohmic film; and
a drain electrode film and a source electrode film that are formed on the barrier film comprising the silicon oxide film,
wherein each of the drain electrode film and the source electrode film comprises a composite copper alloy film which comprises: at least a copper alloy underlayer containing an oxygen-calcium concentrated layer that is formed so as to come into contact with the barrier film comprising the silicon oxide film; and a Cu layer that is formed on the copper alloy underlayer containing an oxygen-calcium concentrated layer,
the copper alloy underlayer containing an oxygen-calcium concentrated layer comprises a concentrated layer, and
the concentrated layer comprises 2 mol % to 30 mol % of Ca, 20 mol % to 50 mol % of oxygen, and as the remainder, Cu and inevitable impurities.

2. A thin-film transistor comprising:
a glass substrate;
a gate electrode film that is formed on the glass substrate;
a silicon nitride film that is formed on the glass substrate and the gate electrode film;
an n⁻ amorphous Si semiconductor film that is formed on the silicon nitride film;
an n⁺ amorphous Si ohmic film that is formed on the n⁻ amorphous Si semiconductor film;
a barrier film that comprises a silicon oxide film formed on the n⁺ amorphous Si ohmic film; and
a drain electrode film and a source electrode film that are formed on the barrier film comprising the silicon oxide film,
wherein each of the drain electrode film and the source electrode film comprises a composite copper alloy film which comprises: at least a copper alloy underlayer containing an oxygen-Ca (Al, Sn, Sb) concentrated layer that is formed so as to come into contact with the barrier film comprising the silicon oxide film; and a Cu alloy layer that is formed on the copper alloy underlayer containing an oxygen-Ca (Al, Sn, Sb) concentrated layer,
the copper alloy underlayer containing an oxygen-Ca (Al, Sn, Sb) concentrated layer is a copper alloy underlayer comprising a concentrated layer, and
the concentrated layer comprises 2 mol % to 30 mol % of Ca, 1 mol % to 10 mol % in total of one or more selected from the group consisting of Al, Sn, and Sb, 20 mol % to 50 mol % of oxygen, and as the remainder, Cu and inevitable impurities.

3. The thin-film transistor according to claim 2, wherein the Cu alloy layer formed on the copper alloy underlayer containing an oxygen-Ca (Al, Sn, Sb) concentrated layer comprises 0.05 mol % to 2 mol % in total of one or more selected from the group consisting of Al, Sn, and Sb, and as the remainder, Cu and inevitable impurities.

* * * * *